US012757514B2

(12) United States Patent
Kwon et al.

(10) Patent No.: US 12,757,514 B2
(45) Date of Patent: Oct. 6, 2026

(54) THREE-LAYERED STACKED IMAGE SENSOR AND METHOD OF MANUFACTURING THE SAME

(71) Applicant: Samsung Electronics Co., Ltd., Suwon-si (KR)

(72) Inventors: Doowon Kwon, Suwon-si (KR); Minho Jang, Suwon-si (KR); Kyungtae Lim, Suwon-si (KR); Doyeon Kim, Suwon-si (KR); Haejung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 486 days.

(21) Appl. No.: 18/354,040

(22) Filed: Jul. 18, 2023

(65) Prior Publication Data

US 2024/0178259 A1 May 30, 2024

(30) Foreign Application Priority Data

Nov. 29, 2022 (KR) ........................ 10-2022-0163418

(51) Int. Cl.
*H10F 39/00* (2025.01)

(52) U.S. Cl.
CPC ......... *H10F 39/811* (2025.01); *H10F 39/026* (2025.01); *H10F 39/8027* (2025.01);
(Continued)

(58) Field of Classification Search
CPC ..... H10F 39/811; H10F 39/807; H10F 39/026
See application file for complete search history.

(56) References Cited

U.S. PATENT DOCUMENTS 6,538,659 B2 3/2003 Fujimura et al.
8,773,562 B1 * 7/2014 Fan ........................ H10F 39/18 348/308

(Continued)

FOREIGN PATENT DOCUMENTS

KR 20190131489 A 11/2019
KR 20210082164 A 7/2021
KR 20220022905 A 2/2022

OTHER PUBLICATIONS

Korean Office Action for corresponding Korean Application No. 10-2022-0163418 dated Jun. 19, 2026.

*Primary Examiner* — Mounir S Amer
*Assistant Examiner* — Alexander Belousov
(74) *Attorney, Agent, or Firm* — Harness, Dickey & Pierce, P.L.C.

(57) ABSTRACT

The inventive concepts provide a three-layered stacked image sensor in which misalignment between a through electrode and a pad is reduced and coupling noise between adjacent pads is reduced, and methods of manufacturing the same. The three-layered stacked image sensor includes an upper chip including pixels arranged in a two-dimensional array structure and a first wiring layer, each of pixels including a photodiode, a transfer gate, and a floating diffusion region, an intermediate chip including a source follower gate, a select gate, and a reset gate corresponding to each of pixels, a first silicon layer, and a second wiring layer, and a lower chip including an image sensor processor, a third wiring layer, and a second silicon layer, a cross-section of an upper portion of a through electrode extending from the second wiring layer through the first silicon layer having an inverted trapezoidal structure.

17 Claims, 26 Drawing Sheets

1000

(52) U.S. Cl.
CPC ..... *H10F 39/8053* (2025.01); *H10F 39/8063* (2025.01); *H10F 39/807* (2025.01); *H10F 39/024* (2025.01)

(56) References Cited

U.S. PATENT DOCUMENTS 9,054,106 B2 6/2015 Kao
9,245,917 B2 * 1/2016 Fan ........................ H04N 25/79
9,406,713 B2 * 8/2016 Fan ........................ H04N 25/79
9,583,465 B1 2/2017 Cheng et al.
9,917,120 B2 * 3/2018 Hynecek .............. H04N 25/771
9,936,150 B2 * 4/2018 Hynecek ............... H10F 39/199
10,003,759 B2 * 6/2018 Fan ........................ H04N 25/00
10,070,079 B2 * 9/2018 Hynecek ............. H10F 39/8057
10,075,663 B2 * 9/2018 Oh ....................... H04N 25/134
10,103,190 B2 * 10/2018 Korobov ................. H10F 39/18
10,186,535 B2 * 1/2019 Hynecek ................ H04N 25/79
10,271,037 B2 * 4/2019 Oh ......................... H04N 25/79
10,462,402 B2 * 10/2019 Fan ........................ H04N 25/70
10,498,996 B2 * 12/2019 Nakamura ........... H04N 17/002
11,018,174 B2 5/2021 Wright
11,043,522 B2 6/2021 Lin et al.
11,201,185 B2 12/2021 Mitsuhashi et al.
11,317,083 B2 * 4/2022 Steadman ............ H04N 25/673
11,329,077 B2 5/2022 Hagimoto
11,637,979 B2 * 4/2023 Lee ...................... H04N 25/709
348/294
11,764,248 B2 * 9/2023 Huang .................. H10F 39/018
257/432
11,985,443 B2 * 5/2024 Gocho ................... H04N 25/79
12,094,908 B2 * 9/2024 Takizawa .............. H10F 39/199
12,159,890 B2 * 12/2024 Kim ...................... H10F 39/811
12,278,254 B2 * 4/2025 Huang .................. H10F 39/018
12,336,315 B2 * 6/2025 Cho .................... H10F 39/8037
12,342,093 B2 * 6/2025 Gocho .................. H10F 39/802
12,445,744 B2 * 10/2025 Kim ....................... H04N 25/47
2014/0211056 A1 * 7/2014 Fan ....................... H10F 39/813
257/292
2014/0320718 A1 * 10/2014 Fan ..................... H10F 39/1534
257/292
2016/0043126 A1 * 2/2016 Fan ................... H10F 39/80377
257/226
2016/0343770 A1 * 11/2016 Fan ....................... H10F 39/812
2017/0134675 A1 * 5/2017 Hynecek ............. H10F 39/8037
2017/0272667 A1 * 9/2017 Hynecek ................ H04N 25/48
2017/0330906 A1 * 11/2017 Korobov ............... H10F 39/813
2018/0084164 A1 * 3/2018 Hynecek ................ H04N 25/17
2018/0213173 A1 * 7/2018 Oh ....................... H04N 25/134
2018/0213205 A1 * 7/2018 Oh ........................ H10F 39/184
2018/0220086 A1 * 8/2018 Hynecek .............. H04N 25/771
2018/0278869 A1 * 9/2018 Fan ........................ H04N 25/79
2019/0149758 A1 * 5/2019 Nakamura ........... H04N 17/002
348/187
2020/0244900 A1 * 7/2020 Hynecek ............... H10F 39/199
2020/0252603 A1 * 8/2020 Steadman .............. H04N 25/79
2021/0029316 A1 * 1/2021 Lee ...................... H04N 25/709
2021/0136299 A1 * 5/2021 Hynecek ................ H04N 25/79
2021/0144324 A1 * 5/2021 Hynecek ................. H10F 39/18
2021/0152771 A1 * 5/2021 Parks ..................... H04N 25/63
2021/0183931 A1 6/2021 Fujii
2021/0400224 A1 * 12/2021 Gocho ................... H04N 25/78
2022/0045117 A1 * 2/2022 Huang .................. H10F 39/018
2022/0270973 A1 8/2022 Verma et al.
2023/0326945 A1 * 10/2023 Kim ..................... H04N 25/772
2023/0361147 A1 * 11/2023 Huang .................. H10F 39/018
2023/0411422 A1 * 12/2023 Kim ...................... H10F 39/811
2024/0038792 A1 * 2/2024 Cho ........................ H04N 25/79
2024/0170521 A1 * 5/2024 Kim ...................... H10F 39/026
2024/0178259 A1 * 5/2024 Kwon ................. H10F 39/8063
2024/0236517 A1 * 7/2024 Kim ........................ H04N 25/47
2024/0267654 A1 * 8/2024 Gocho ................. H04N 25/587
2024/0347576 A1 * 10/2024 Yang ....................... H10F 39/18
2024/0363668 A1 * 10/2024 Huang .................. H10F 39/018
2024/0429259 A1 * 12/2024 Pyo ....................... H10F 39/806
2025/0150733 A1 * 5/2025 Jung .................... H04N 25/616
2025/0194281 A1 * 6/2025 Huang .................. H10F 39/809
2025/0386115 A1 * 12/2025 Kim ........................ H04N 25/47
2025/0392845 A1 * 12/2025 Lee ........................ H04N 25/79
2026/0059870 A1 * 2/2026 Chuang ................... H10F 39/18

* cited by examiner

THREE-LAYERED STACKED IMAGE SENSOR AND METHOD OF MANUFACTURING THE SAME

CROSS-REFERENCE TO RELATED APPLICATION

This application is based on and claims priority under 35 U.S.C. § 119 to Korean Patent Application No. 10-2022-0163418, filed on Nov. 29, 2022, in the Korean Intellectual Property Office, the disclosure of which is incorporated by reference herein in its entirety.

BACKGROUND

The inventive concepts relate to image sensors, and particularly, to image sensors having a three-layered stacked structure and methods of manufacturing the image sensor.

Along with the high level development of the electronics industry, the sizes of image sensors have gradually decreased, and various research for satisfying the demand for high integration of image sensors have been conducted. In general, an image sensor, for example, a complementary metal oxide semiconductor (CMOS) image sensor (CIS), may include a pixel area and a logic area. In the pixel area, a plurality of pixels may be arranged in a two-dimensional array structure, and a unit pixel constituting the pixels may include a photodiode and pixel transistors. In addition, in the logic area, logic devices configured to process pixel signals from the pixel area may be arranged. Recently, a CIS having a stacked structure in which a pixel area and a logic area are formed in respective chips and stacked for high integration of the CIS has been developed.

SUMMARY

The inventive concepts provide three-layered stacked image sensors in which misalignment between a through electrode and a pad is minimized or reduced and coupling noise between adjacent pads is prevented or reduced from occurring, and methods of manufacturing the three-layered stacked image sensor.

In addition, the problems to be solved by the technical ideas of the inventive concepts are not limited to the problems mentioned above, and the other problems could be clearly understood by those of ordinary skill in the art from the description below.

According to some aspects of the inventive concepts, there is provided a three-layered stacked image sensor including an upper chip including a plurality of pixels arranged in a two-dimensional array structure, and a first wiring layer disposed beneath the plurality of pixels, each of the plurality of pixels including a photodiode (PD), a transfer gate (TG), and a floating diffusion (FD) region, an intermediate chip including a source follower gate (SF), a select gate (SEL), and a reset gate (RG) corresponding to each of the plurality of pixels, a first silicon layer at an upper portion thereof, and a second wiring layer at a lower portion thereof, and a lower chip including an image sensor processor (ISP), a third wiring layer at an upper portion thereof, and a second silicon layer at a lower portion thereof, wherein the upper chip, the intermediate chip, and the lower chip are sequentially disposed from the top, a first pad of the first wiring layer and an upper pad of the intermediate chip are bonded to each other, a second pad of the second wiring layer and a third pad of the third wiring layer are bonded to each other, the upper pad is disposed on a through electrode extending from the second wiring layer through the first silicon layer, and a cross-section of an upper portion of the through electrode has an inverted trapezoidal structure.

According to some aspects of the inventive concepts, there is provided a three-layered stacked image sensor including a first chip disposed at the top and including a photodiode (PD), a transfer gate (TG), a floating diffusion (FD) region, and a first wiring layer, a second chip disposed at an intermediate position and including a source follower gate (SF), a select gate (SEL), a reset gate (RG), and a second wiring layer, and a third chip disposed at the bottom and including an image sensor processor (ISP) and a third wiring layer, wherein the second chip includes a silicon layer on the second wiring layer, an upper pad on the silicon layer, and a through electrode extending from the second wiring layer through the silicon layer and connected to the upper pad, a first pad of the first wiring layer and the upper pad are bonded to each other, a second pad of the second wiring layer and a third pad of the third wiring layer are bonded to each other, and a cross-section of an upper portion of the through electrode bonded to the upper pad has an inverted trapezoidal structure.

According to some aspects of the inventive concepts, there is provided a three-layered stacked image sensor including an upper chip including a plurality of pixels arranged in a two-dimensional array structure, a first wiring layer disposed beneath the plurality of pixels, and a color filter and a microlens disposed on each of the plurality of pixels, each of the plurality of pixels including a photodiode (PD), a transfer gate (TG), and a floating diffusion (FD) region, an intermediate chip including a source follower gate (SF), a select gate (SEL), and a reset gate (RG) corresponding to each of the plurality of pixels, a first silicon layer and an upper insulating layer at an upper portion thereof, and a second wiring layer at a lower portion thereof, and a lower chip including an image sensor processor (ISP), a third wiring layer at an upper portion thereof, and a second silicon layer at a lower portion thereof, wherein the intermediate chip includes a through electrode extending from the second wiring layer through the first silicon layer and the upper insulating layer, and an upper pad on the through electrode, the upper chip, the intermediate chip, and the lower chip are sequentially disposed from the top, a first pad of the first wiring layer and the upper pad are bonded to each other, a second pad of the second wiring layer and a third pad of the third wiring layer are bonded to each other, and a cross-section of a portion of the through electrode corresponding to the upper insulating layer has an inverted trapezoidal structure.

According to some aspects of the inventive concepts, there is provided a method of manufacturing a three-layered stacked image sensor, the method including forming a first wiring layer and a first pad in a first wafer, forming a second wiring layer and a second pad in a second wafer, bonding the first wafer and the second wafer to each other such that the first pad and the second pad corresponding thereto are bonded to each other, grinding a first silicon layer of the second wafer, forming a through electrode, extending from the second wiring layer through the first silicon layer, and an upper pad on the through electrode, forming a third wiring layer and a third pad in a third wafer, bonding the second wafer and the third wafer such that the third pad and the upper pad corresponding thereto are bonded to each other, grinding a second silicon layer of the third wafer, and forming a color filter and a microlens on the second silicon layer, wherein a cross-section of an upper portion of the through electrode bonded to the upper pad has an inverted trapezoidal structure.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
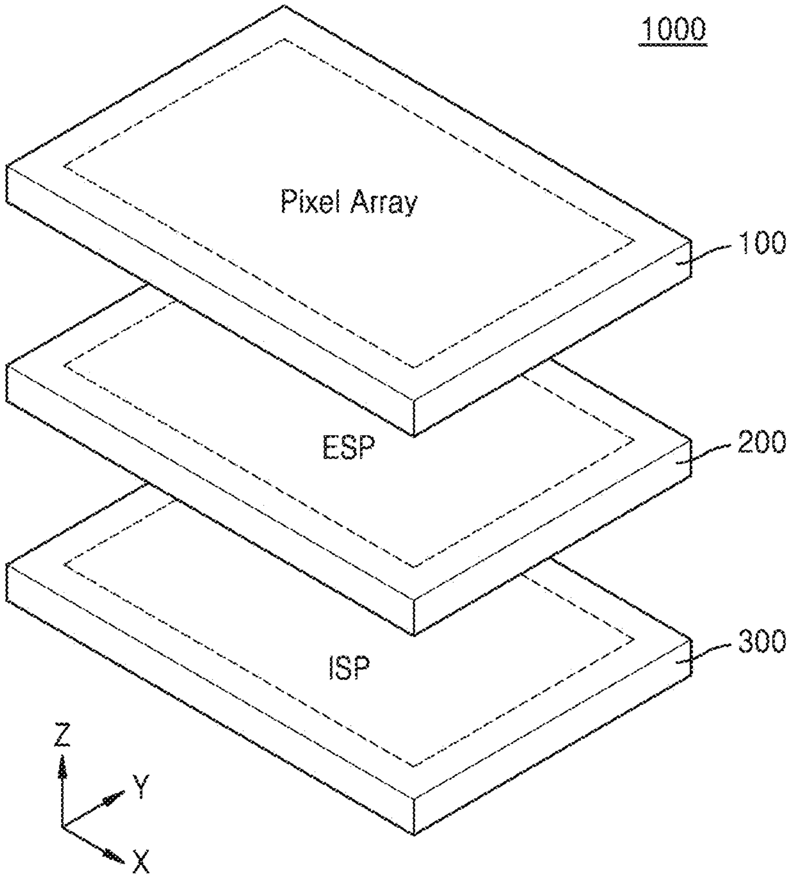
FIGS. 1A to 1C are, respectively, an exploded perspective view, a top view, and a cross-sectional view of a three-layered stacked image sensor according to some example embodiments.

Hereinafter, example embodiments are described in detail with reference to the accompanying drawings. Like reference numerals in the drawings denote like elements, and thus their repetitive description is omitted.

Figure 1B:
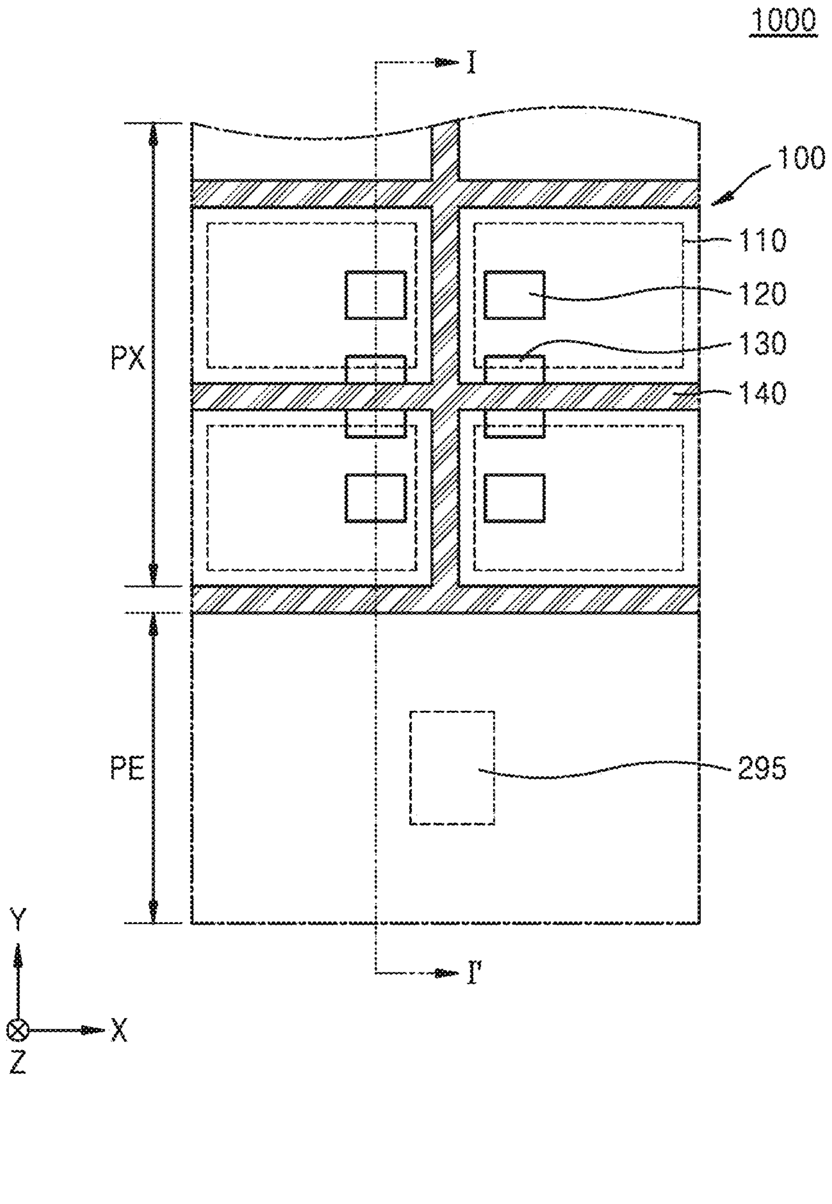
Figure 1C:
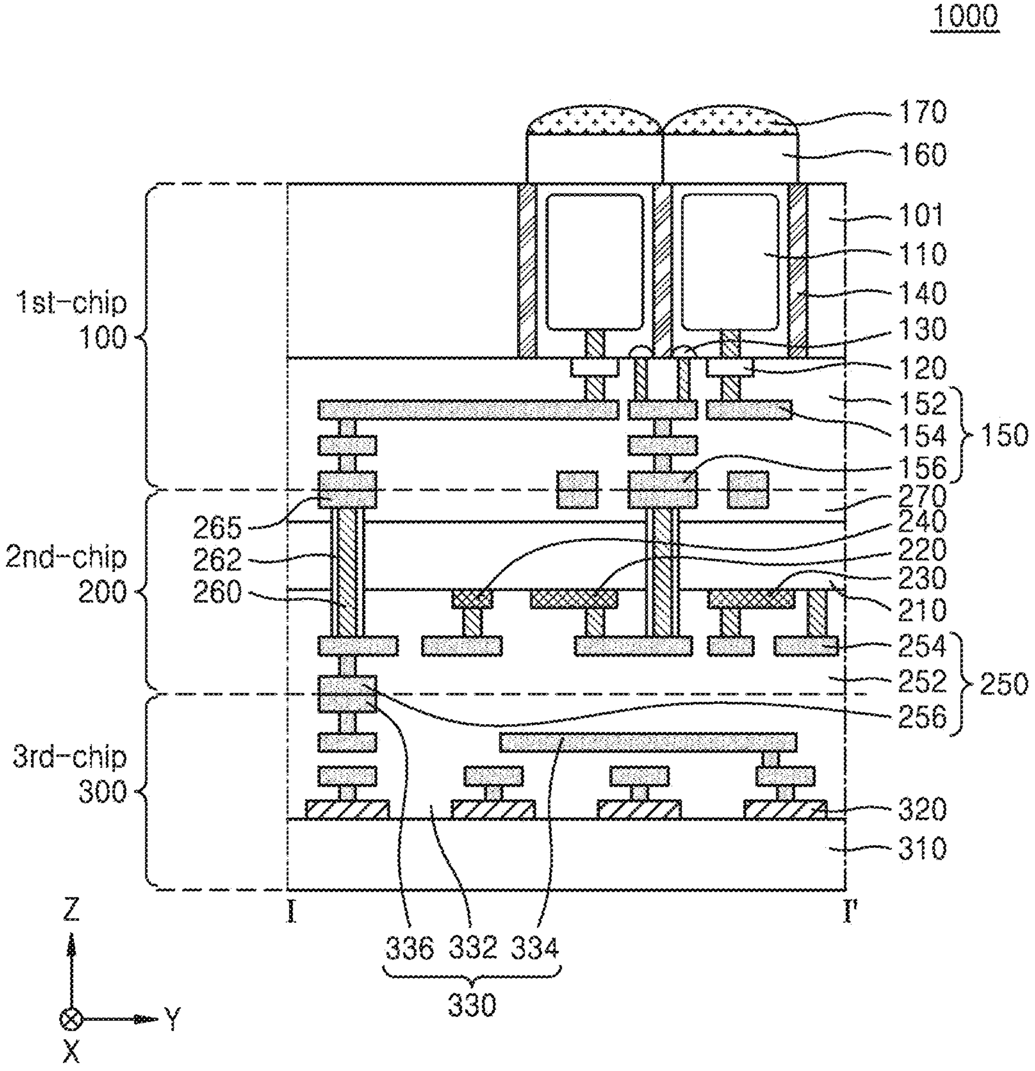

FIGS. 1A to 1C are, respectively, an exploded perspective view, a top view, and a cross-sectional view of a three-layered stacked image sensor 1000 according to some example embodiments, FIG. 1B is a top view of a portion of an upper surface of the three-layered stacked image sensor 1000 of FIG. 1A, and FIG. 1C is a cross-sectional view taken along line I-I' of FIG. 1B.

Referring to FIG. 1A, the three-layered stacked image sensor (hereinafter, simply "image sensor") 1000 according to some example embodiments is, for example, a complementary metal oxide semiconductor (CMOS) image sensor (CIS) and may include three semiconductor chips, e.g., a first chip (1st-chip) 100, a second chip (2nd-chip) 200, and a third chip (3rd-chip) 300. Particularly, the image sensor 1000 according to some example embodiments may include the 1st-chip 100 in which pixels are arranged, the 2nd-chip 200 in which transistors configured to process electron signals are arranged, and the 3rd-chip 300 in which logic circuits configured to process an image signal are arranged.

For example, the 1st-chip 100 may include a pixel array in which pixels are arranged in a two-dimensional array structure. The 2nd-chip 200 may include an electron signal process unit (ESP) including a source follower gate (SF) 220, a reset gate (RG) 230, and a select gate (SEL) 240. The 3rd-chip 300 may include an image sensor processor (ISP) including an analog-digital converter (ADC) and readout circuitry. In addition, the ISP in the 3rd-chip 300 is not limited to the ADC and the readout circuitry and may further include analog signal processing circuitry, image signal processing circuitry, control circuitry, and the like. According to some example embodiments, the ADC may be included in the 2nd-chip 200. The image sensor 1000 according to some example embodiments may implement high image quality by maximizing or increasing the number of pixels in the 1st-chip 100 and optimize or improve signal processing through the 2nd-chip 200 and the 3rd-chip 300.

As shown in FIG. 1A, in the image sensor 1000 according to some example embodiments, in a vertical direction, e.g., a third direction (a Z direction), the 1st-chip 100 may be at the top, the 2nd-chip 200 may be beneath the 1st-chip 100, and the 3rd-chip 300 may be beneath the 2nd-chip 200. The 1st-chip 100 and the 2nd-chip 200 may be bonded to each other through pads by copper (Cu)—Cu bonding. In addition, the 2nd-chip 200 and the 3rd-chip 300 may also be bonded to each other through pads by Cu—Cu bonding. In general, in case of Cu—Cu bonding between chips, silicon nitride (SiNx) or silicon oxide ($SiO_2$) in the proximity of the pads may be further bonded to each other, and thus, Cu—Cu bonding is also called hybrid bonding (HB).

In some example embodiments, in the image sensor 1000 according to some example embodiments, the 1st-chip 100, the 2nd-chip 200, and the 3rd-chip 300 may be bonded to each other at a wafer level. For example, a first wafer including a plurality of 1st-chips 100, a second wafer including a plurality of 2nd-chips 200, and a third wafer including a plurality of 3rd-chips 300 may be bonded by Cu—Cu bonding or HB and then divided into a plurality of stacked structures through a sawing process and/or the like. Each of the plurality of stacked structures may correspond to the image sensor 1000 according to some example embodiments, including the 1st-chip 100, the 2nd-chip 200, and the 3rd-chip 300. Hereinafter, a structure of the image sensor 1000 according to some example embodiments is described in more detail with reference to FIGS. 1B and 1C.

Referring to FIGS. 1B and 1C, the image sensor 1000 according to some example embodiments may include a pixel area PX and a peripheral area PE. The pixel area PX may be an area in which pixels are arranged, and the peripheral area PE may be an area in which connection wirings, through which an electrical signal is transferred in the third direction (the Z direction), and an input-output pad 295, through which the electrical signal is exchanged with the outside, are arranged. In some example embodiments, the peripheral area PE may surround the pixel area PX. However, a structure of the peripheral area PE and the pixel area PX is not limited thereto. For example, the peripheral area PE may not be on at least one of four sides of the pixel area PX.

As described above, the image sensor 1000 according to some example embodiments may include the 1st-chip 100, the 2nd-chip 200, and the 3rd-chip 300 sequentially stacked in the third direction (the Z direction). The 1st-chip 100 may include a first substrate 101, the 2nd-chip 200 may include a second substrate 210, and the 3rd-chip 300 may include a third substrate 310. The first to third substrates 101, 210, and 310 may include, for example, a semiconductor material, such as silicon (Si), germanium (Ge), or Si—Ge, or a Group III-V compound, such as gallium phosphide (GaP), gallium arsenide (GaAs), or gallium antimonide (GaSb). However, in some example embodiments, at least some of the first to third substrates 101, 210, and 310 may include a silicon-on-insulator (SOI) substrate or a germanium-on-insulator (GOI) substrate.

In the image sensor 1000 according to some example embodiments, the first to third substrates 101, 210, and 310 may include, for example, an Si substrate. In addition, in the image sensor 1000 according to some example embodiments, devices configured to convert incident light into an electron signal may be on the first substrate 101. Devices configured to convert the converted electron signal into a voltage signal may be on the second substrate 210. Logic circuits configured to process an electrical signal, such as an electron signal or a voltage signal, may be on the third substrate 310.

Particularly, as shown in FIG. 1C, in the 1st-chip 100, from the top in the third direction (the Z direction), the first substrate 101 and a first wiring layer 150 may be sequentially disposed. In addition, in the first substrate 101, a photodiode (PD) 110 and a deep trench isolation (DTI) 140 may be arranged. In addition, a vertical gate-structured transfer gate (TG) 120 in contact with the PD 110 may be on a lower surface of the first substrate 101, and a floating diffusion (FD) region 130 may be adjacent to the TG 120.

As shown in FIG. 1B, the DTI 140 may isolate pixels or PDs 110 from each other in a rectangular lattice form. As a reference, the PD 110 and a pixel are similar in a horizontal shape, but the pixel may further include the TG 120, the FD region 130, and the like in addition to the PD 110. The DTI 140 may include a central conductive layer and a sidewall insulating layer surrounding the central conductive layer. The central conductive layer may include, for example, polysilicon. However, a material of the central conductive layer is not limited to polysilicon.

The TG 120 may include an embedded portion extending upward from the lower surface of the first substrate 101 in the third direction (the Z direction) and a protrusion portion on the lower surface of the first substrate 101. The TG 120 may one-to-one correspond to a pixel or the PD 110. The FD region 130 may be adjacent to the TG 120 at a lower portion of the first substrate 101. The FD region 130 may form a source/drain region of the TG 120.

The first wiring layer 150 may include a first interlayer insulating layer 152, a first wiring 154, and a first pad 156. The first wiring 154 may include a horizontal wiring and a vertical via. When a plurality of layers of horizontal wirings are formed, the horizontal wirings in different layers may be connected to each other via the vertical via. In addition, a horizontal layer (e.g., an M1 metal) in the top layer among the horizontal wirings may be connected to the TG 120 and the FD region 130 via the vertical via. Although FIG. 1C shows two layers of horizontal wirings, the number of layers of horizontal wirings in the first wiring 154 is not limited to two. The first interlayer insulating layer 152 may include a nitride layer, an oxide layer, an oxynitride layer, or the like.

The first pad 156 may be on a lower surface of the first interlayer insulating layer 152. The first pad 156 may be connected to the horizontal wiring of the first wiring 154 via the vertical via. According to some example embodiments, the first pad 156 may be included as a portion of the first wiring 154. The first pad 156 may include Cu. Therefore, the first pad 156 may be a Cu pad. As shown in FIG. 1C, the first pad 156 and an upper pad 265 in the 2nd-chip 200 may be bonded to each other. The upper pad 265 may also be a Cu pad, and thus, the first pad 156 and the upper pad 265 may be Cu—Cu bonded to each other. In addition, by bonding the first interlayer insulating layer 152 and an upper insulating layer 270 in the 2nd-chip 200 to each other, the 1st-chip 100 and the 2nd-chip 200 may be bonded to each other by HB. As a reference, in case of bonding between interlayer insulating layers or between an interlayer insulating layer and an upper insulating layer, separate adhesive layers (see, for example, the first adhesive layer 158 and the second adhesive layer 277 of FIG. 4B), such as a nitride layer or an oxide layer, may be on outermost periphery portions thereof, and the adhesive layers may be bonded to each other. However, hereinafter, unless an adhesive layer is particularly shown in a drawing, an adhesive layer is considered as a portion of an interlayer insulating layer or an upper insulating layer.

In addition, a planarization layer may be on an upper surface of the first substrate 101. In addition, in correspondence to each pixel, color filters 160 and a microlens 170 may be on the planarization layer of the pixel area PX. A light-blocking metal layer, an upper planarization layer, and the like may be on the planarization layer of the peripheral area PE.

The color filters 160 may include a green filter G, a blue filter B, and a red filter R. However, a combination of the color filters 160 is not limited thereto, and may include, for example, a cyan filter C, a magenta filter M, and a yellow filter Y, among other combinations. In addition, an interference prevention structure of a lattice form may be between the color filters 160. The interference prevention structure may include, for example, a metal and/or a low refractive material.

The microlens 170 and the upper planarization layer may include, for example, a material having a high transmittance. In addition, a transparent protective layer formed of silicon oxide (SiO), silicon oxycarbide (SiOC), silicon carbide (SiC), silicon carbon nitride (SiNC), or the like may be on the microlens 170 and the upper planarization layer.

In addition, although not shown in FIGS. 1A to 1C, a through hole exposing an upper surface the input-output pad 295 in the 2nd-chip 200 by passing through the upper planarization layer, the light-blocking metal layer, the first substrate 101, the first interlayer insulating layer 152, and the upper insulating layer 270 may be formed in the peripheral area PE. Through the through hole, a conductive wire may be electrically connected to the input-output pad 295.

In the 2nd-chip 200, from the top in the third direction (the Z direction), the second substrate 210 and a second wiring layer 250 may be sequentially disposed. In addition, the upper insulating layer 270 may be at an upper portion of the second substrate 210. In the pixel area PX, an SF 220, an RG 230, and SEL 240 may be on a lower surface of the second substrate 210. The SF 220, the RG 230, and the SEL 240 may constitute a source follower transistor (TR), a reset TR, and a select TR together with active regions of the second substrate 210, respectively.

The second wiring layer 250 may include a second interlayer insulating layer 252, a second wiring 254, and a second pad 256. The second wiring 254 may include a horizontal wiring and a vertical via. In addition, the horizontal wiring (e.g., an M1 metal) may be connected to the SF 220, the RG 230, and the SEL 240 via the vertical via. Although FIG. 1C shows one layer of horizontal wiring, the number of layers of horizontal wirings in the second wiring 254 is not limited to one. For example, two or more layers of horizontal wirings may be included in the second wiring 254. In this case, the horizontal wirings in different layers may be connected to each other via the vertical via. The second interlayer insulating layer 252 may include a nitride layer, an oxide layer, an oxynitride layer, or the like.

The second pad 256 may be on a lower surface of the second interlayer insulating layer 252. The second pad 256 may be connected to the horizontal wiring of the second wiring 254 via the vertical via. According to some example embodiments, the second pad 256 may be included as a portion of the second wiring 254. The second pad 256 may be a Cu pad including Cu. In addition, as shown in FIG. 1C, the second pad 256 and a third pad 336 in the 3rd-chip 300 may be bonded to each other. The third pad 336 may also be a Cu pad, and thus, the second pad 256 and the third pad 336 may be Cu—Cu bonded to each other. In addition, by bonding the second interlayer insulating layer 252 and a third interlayer insulating layer 332 in the 3rd-chip 300 to each other, the 2nd-chip 200 and the 3rd-chip 300 may be bonded to each other by HB.

The input-output pad 295 may be in the second wiring layer 250 of the peripheral area PE. The input-output pad 295 may be connected to the horizontal wiring of the second wiring 254 directly or via the vertical via. In some example embodiments, the input-output pad 295 may be included as a portion of the second wiring 254.

The upper insulating layer 270 may be on an upper surface of the second substrate 210. The upper insulating layer 270 may include a plurality of layers. The upper pad 265 may be on an upper surface of the upper insulating layer 270. As described above, the upper pad 265 and the first pad 156 in the 1st-chip 100 may be Cu—Cu bonded to each other. A detailed structure of the upper insulating layer 270 is described in more detail with reference to FIG. 4A.

In the 2nd-chip 200, a through electrode 260 may be in contact with the upper pad 265 and the second wiring 254 by passing through an upper portion of the second interlayer insulating layer 252, the second substrate 210, and the upper insulating layer 270. The through electrode 260 may be isolated from the second substrate 210 by a sidewall insulating layer 262 surrounding the through electrode 260. The through electrode 260 may be in both the pixel area PX and the peripheral area PE. Because the through electrode 260 passes through the second substrate 210 of Si, the through electrode 260 may correspond to a through silicon via (TSV).

The through electrode 260 may have a shape of calyx (see FC of FIG. 2A) at an upper portion thereof, e.g., a portion passing through the upper insulating layer 270. In other words, the upper portion of the through electrode 260 may have a shape having a width gradually decreasing downward. Accordingly, a vertical cross-section of the upper portion of the through electrode 260 may have an inverted trapezoidal shape. A structure of the upper insulating layer 270 and the upper pad 265 connected thereto is described in more detail with reference to FIGS. 2A to 3B.

In the 3rd-chip 300, from the bottom in the third direction (the Z direction), the third substrate 310 and a third wiring layer 330 may be sequentially disposed. Gates 320 may be on an upper surface of the third substrate 310. The gates 320 may constitute TRs together with active regions of the third substrate 310. These TRs may constitute logic circuits in the 3rd-chip 300.

The third wiring layer 330 may include a third interlayer insulating layer 332, a third wiring 334, and the third pad 336. The third wiring 334 may include a horizontal wiring and a vertical via. In addition, the horizontal wiring (e.g., an M1 metal) may be connected to the gates 320 via the vertical via. Although FIG. 1C shows two layers of horizontal wirings, the number of layers of horizontal wirings in the third wiring 334 is not limited to two. For example, three or more layers of horizontal wirings may be included in the third wiring 334. When a plurality of layers of horizontal wirings are formed, the horizontal wirings in different layers may be connected to each other via the vertical via. The third interlayer insulating layer 332 may include a nitride layer, an oxide layer, an oxynitride layer, or the like.

The third pad 336 may be on an upper surface of the third interlayer insulating layer 332. The third pad 336 may be connected to the horizontal wiring of the third wiring 334 via the vertical via. According to some example embodiments, the third pad 336 may be included as a portion of the third wiring 334. The third pad 336 may be a Cu pad including Cu. In addition, as shown in FIG. 1C, the third pad 336 and the second pad 256 in the 2nd-chip 200 may be Cu—Cu bonded to each other. In addition, by bonding the second interlayer insulating layer 252 and the third interlayer insulating layer 332 to each other, the 2nd-chip 200 and the 3rd-chip 300 may be bonded to each other by HB.

In the image sensor 1000 according to some example embodiments, the 1st-chip 100 and the 2nd-chip 200 may be bonded to each other by HB through Cu—Cu bonding and bonding between an interlayer insulating layer and an upper insulating layer. In addition, the 2nd-chip 200 and the 3rd-chip 300 may be bonded to each other by HB through Cu—Cu bonding and bonding between interlayer insulating layers. The FD region 130 in the 1st-chip 100 may be connected to the SF 220 in the 2nd-chip 200 via the first wiring 154 and the first pad 156 of the first wiring layer 150, the upper pad 265, the through electrode 260, and the second wiring 254 of the second wiring layer 250. In addition, the FD region 130 may be connected to a source/drain of the RG 230 in the 2nd-chip 200 through a similar path.

The TG 120 in the 1st-chip 100 may be connected to the third wiring layer 330 in the 3rd-chip 300 via the first wiring layer 150, the upper pad 265, the through electrode 260, and the second wiring layer 250. In addition, although not clearly shown in FIG. 1C, the RG 230 and the SEL 240 may also be connected to the third wiring layer 330 in the 3rd-chip 300 via the second wiring layer 250.

In the image sensor 1000 according to some example embodiments, an upper portion of the through electrode 260 may have a calyx shape, that is, a cross-section of the upper portion may have an inverted trapezoidal shape. Accordingly, an upper surface of the through electrode 260 may be wide, and accordingly, misalignment between the through electrode 260 and the upper pad 265 may be minimized or reduced. In addition, when the upper pad 265 is formed, a degree of placement freedom may increase, and a patterning process control may be easy. Furthermore, on the basis of the degree of placement freedom of the upper pad 265, the reliability of Cu—Cu bonding between the upper pad 265 and the first pad 156 in the 1st-chip 100 may also increase.

In addition, although not shown in FIG. 1C, the image sensor 1000 according to some example embodiments may further include first and second shielding conductive layers 180 and 280 (see, e.g., FIG. 4B) at both sides of the first pad 156 and/or the upper pad 265. The first and second shielding conductive layers 180 and 280 may be connected to ground. As such, by arranging the first and second shielding conductive layers 180 and 280 to be adjacent to the first pad 156 and/or the upper pad 265, coupling noise between adjacent first pads, adjacent upper pads, or adjacent Cu—Cu bonding structures may be prevented or reduced. The first and second shielding conductive layers 180 and 280 are described in more detail with reference to FIGS. 4A and 4B.

Figure 2A:
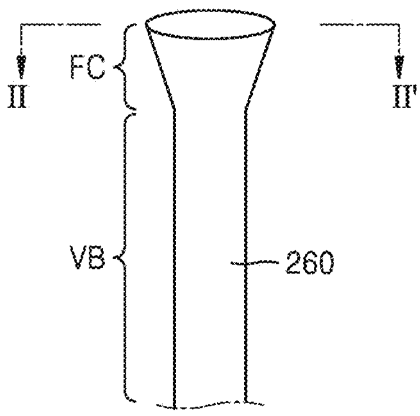
FIGS. 2A and 2B are, respectively, a perspective view and a cross-sectional view illustrating a structure of a through electrode in a second chip in the three-layered stacked image sensor of FIG. 1C.
Figure 2B:
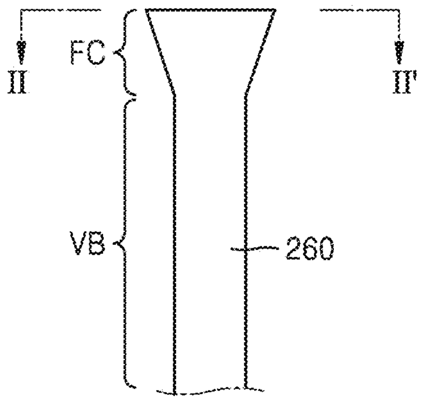

FIGS. 2A and 2B are, respectively, a perspective view and a cross-sectional view illustrating a structure of the through electrode 260 in the 2nd-chip 200 in the image sensor 1000 of FIG. 1C. FIG. 2B is a cross-sectional view taken along line II-II' of FIG. 2A. A description below is made with reference to FIG. 1C together, and a description made with reference to FIGS. 1A to 1C is simply repeated or omitted.

Referring to FIGS. 2A and 2B, in the image sensor 1000 according to some example embodiments, the through electrode 260 in the 2nd-chip 200 may include a via body VB and a via head FC. The via body VB may occupy most of the through electrode 260 except for a portion of the via head FC, for example, occupy a central portion and a lower portion of the through electrode 260. The via body VB may extend in the third direction (the Z direction) with a uniform or substantially uniform width or diameter. The via head FC may be at an upper portion of the through electrode 260 and have a shape with a width gradually increasing upward in the third direction (the Z direction), e.g., a calyx shape. That is, as shown in the cross-sectional view of FIG. 2B, a cross-section of the via head FC may have an inverted trapezoidal shape. In some example embodiments, the via head FC may begin when the diameter of the through electrode 260 begins to increase at a different rate such that the slope of the surface of a cross-section thereof changes. That is, the via head FC and the via body VB may have different diameters and diameter rates of change in the third direction (the Z direction). As such, in the image sensor 1000 according to some example embodiments, because the through electrode 260 includes the via head FC at the upper portion thereof to thereby maximize or increase an area of the upper surface of the through electrode 260, misalignment with the upper pad 265 thereon may be minimized or reduced.

Figure 3A:
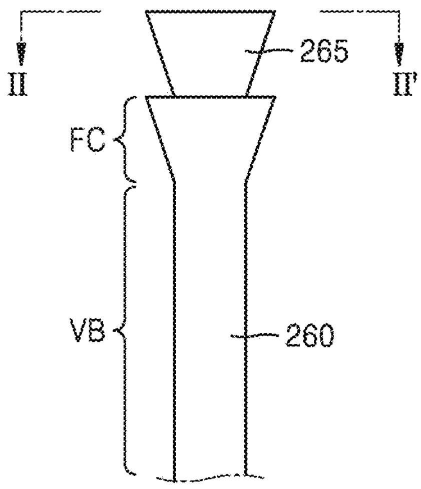
FIGS. 3A and 3B are cross-sectional views illustrating structures in which the through electrode and a pad in the second chip in the three-layered stacked image sensor of FIG. 1C are bonded to each other.
Figure 3B:
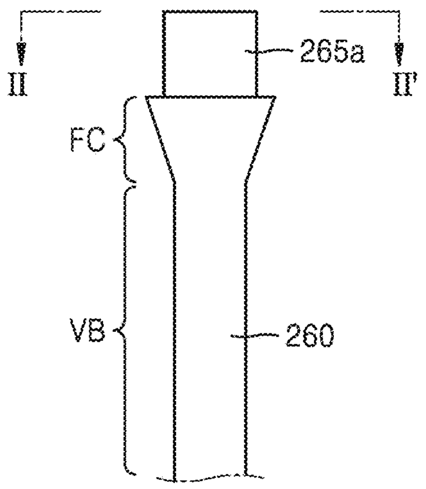

FIGS. 3A and 3B are cross-sectional views illustrating structures in which the through electrode 260 and a pad in the 2nd-chip 200 in the image sensor 1000 of FIG. 1C are coupled to each other. A description below is made with reference to FIG. 1C together, and a description made with reference to FIGS. 1A to 2B is simply repeated or omitted.

Referring to FIG. 3A, in the image sensor 1000 according to some example embodiments, the through electrode 260 in the 2nd-chip 200 may include the via body VB and the via head FC, and the upper pad 265 may be on the through electrode 260. The upper pad 265 may have a shape with a wide upper surface and a narrow lower surface. For example, the upper pad 265 may generally have a calyx shape. Accordingly, as shown in FIG. 3A, a cross-section of the upper pad 265 may have an inverted trapezoidal shape.

The lower surface of the upper pad 265 may have a less area than the upper surface of the through electrode 260, e.g., an upper surface of the via head FC. As such, because the lower surface of the upper pad 265 has less area than the upper surface of the through electrode 260, misalignment between the upper pad 265 and the through electrode 260 may be minimized or reduced. According to some example embodiments, the lower surface of the upper pad 265 may have the same or substantially the same area as the upper surface of the through electrode 260.

Referring to FIG. 3B, in the image sensor 1000 according to some example embodiments, the through electrode 260 in the 2nd-chip 200 may include the via body VB and the via head FC, and an upper pad **265*a* may be on the through electrode 260. As shown in FIG. 3B, the upper pad 265*a* may have the same or substantially the same upper surface and lower surface. For example, the upper pad 265*a* may generally have a cylindrical shape. In some example embodiments, the upper pad 265*a* may have a rectangular shape, however, the example embodiments are not limited thereto and other shapes having a similar cross-section as shown in FIG. 3B may be used. Accordingly, as shown in FIG. 3B, a cross-section of the upper pad 265*a*** may have a rectangular shape.

The lower surface of the upper pad 265 may have a less area than the upper surface of the through electrode 260, e.g., the upper surface of the via head FC. As such, because the lower surface of the upper pad **265*a* has a less area than the upper surface of the through electrode 260, misalignment between the upper pad 265*a* and the through electrode 260 may be minimized or reduced. According to some example embodiments, the lower surface of the upper pad 265*a* may have the same or substantially the same area as the upper surface of the through electrode 260**.

Figure 4A:
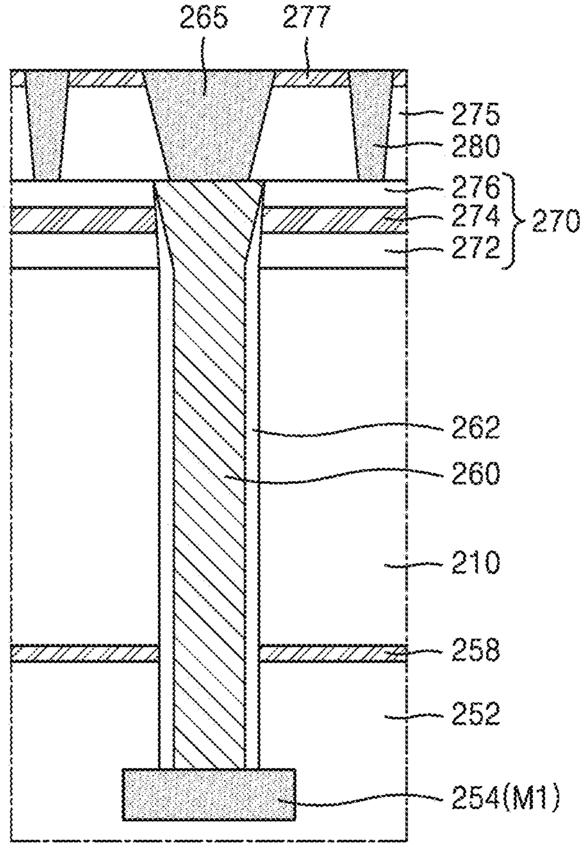
FIG. 4A is a cross-sectional view illustrating a bonding structure of the through electrode and the upper pad and a second shielding conductive layer in the second chip in the three-layered stacked image sensor of FIG. 1C.
Figure 4B:
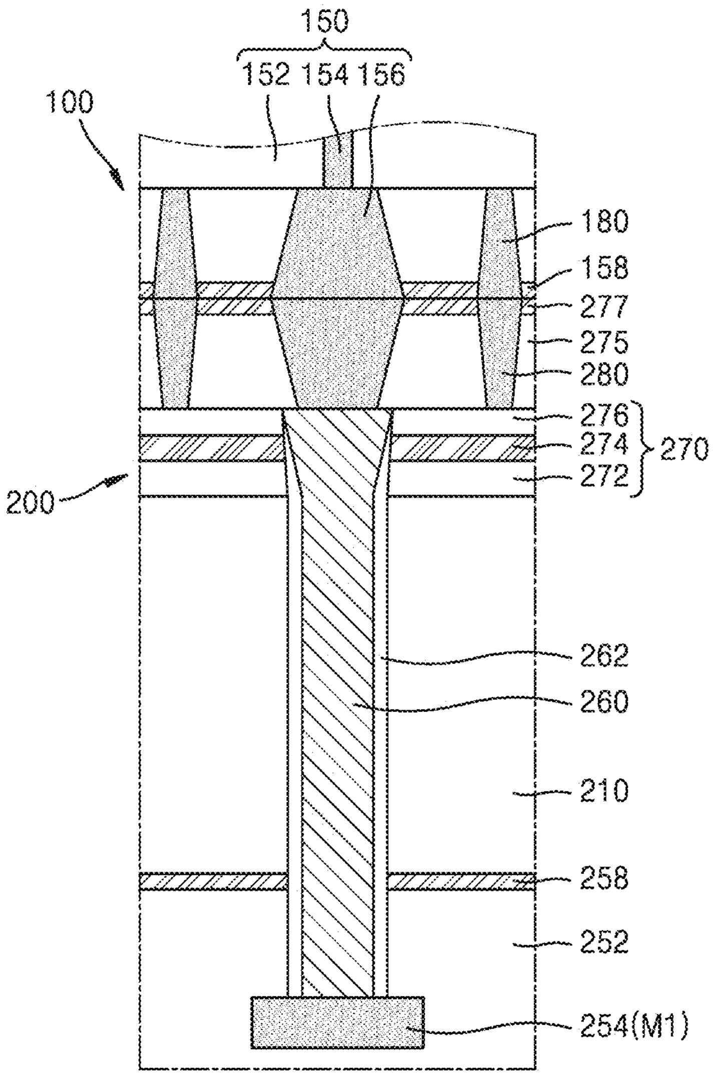
FIG. 4B is a cross-sectional view illustrating a structure in which a first chip and the second chip are bonded to each other through pads and shielding conductive layers in the three-layered stacked image sensor of FIG. 1C.

FIG. 4A is a cross-sectional view illustrating a bonding structure of the through electrode 260 and the upper pad 265 and the second shielding conductive layer 280 in the 2nd-chip 200 in the image sensor 1000 of FIG. 1C, and FIG. 4B is a cross-sectional view illustrating a structure in which the 1st-chip 100 and the 2nd-chip 200 are bonded to each other through pads and the first and second shielding conductive layers 180 and 280 in the image sensor 1000 of FIG. 1C. A description below is made with reference to FIG. 1C together, and a description made with reference to FIGS. 1A to 3B is simply repeated or omitted.

Referring to FIG. 4A, in the image sensor 1000 according to some example embodiments, the through electrode 260 in the 2nd-chip 200 may extend upwards in the vertical direction (Z direction) from the second wiring 254 by passing through an upper portion of the second interlayer insulating layer 252, an etching stop layer 258, the second substrate 210, and the upper insulating layer 270. The lower surface of the through electrode 260 may be connected to the second wiring 254, e.g., an M1 metal, and the upper surface thereof may be connected to the upper pad 265. Herein, the M1 metal may indicate a metal wiring connected to a gate formed on the second substrate 210. A side surface of the through electrode 260 may be surrounded by the sidewall insulating layer 262, and accordingly, the through electrode 260 may be isolated from the second substrate 210.

The upper portion, e.g., the via head FC, of the through electrode 260 may be at a portion passing through the upper insulating layer 270. At the portion of the upper insulating layer 270, a thickness of a portion of the sidewall insulating layer 262 surrounding the via head FC may be less than a thickness of a portion of the sidewall insulating layer 262 surrounding the via body VB. In addition, the thickness of the portion of the sidewall insulating layer 262 surrounding the via head FC may gradually decrease upward, matching or substantially matching an increase in diameter of the through electrode 260. According to a shape of the portion of the sidewall insulating layer 262 surrounding the via head FC, the via head FC of the through electrode 260 may have a calyx shape. A method of forming the via head FC of the through electrode 260 in a calyx shape is described in more detail with reference to FIGS. 8A to 8F.

The upper insulating layer 270 may have a multi-layer structure. The upper insulating layer 270 may include, for example, a first insulating layer 272, a second insulating layer 274, and a third insulating layer 276. Herein, the first insulating layer 272 and the third insulating layer 276 may include an oxide layer, and the second insulating layer 274 may include a nitride layer. However, materials of the first insulating layer 272, the second insulating layer 274, and the third insulating layer 276 are not limited to the materials described above. In addition, the number of layers of the upper insulating layer 270 is not limited to three. For example, the upper insulating layer 270 may be formed as a single layer, two layers, or four or more layers. In some example embodiments, the via head FC may begin at or about a lower surface of the first insulating layer 272 in the vertical direction (Z direction) or the interface between the first insulating layer 272 and the upper insulating layer 270.

A passivation layer 275 and a second adhesive layer 277 may be on the through electrode 260 and the upper insulating layer 270. The passivation layer 275 may include an oxide layer, and the second adhesive layer 277 may include a nitride layer. However, materials of the passivation layer 275 and the second adhesive layer 277 are not limited to the materials described above. According to some example embodiments, the passivation layer 275 and the second adhesive layer 277 may be included as a portion of the upper insulating layer 270.

The upper pad 265 may be on the through electrode 260 and have a structure of passing through the passivation layer 275 and the second adhesive layer 277. As shown in FIG. 3A, the upper pad 265 may have a wider upper part and a narrower lower part. However, a shape of the upper pad 265 is not limited thereto.

In the image sensor 1000 according to some example embodiments, the 2nd-chip 200 may include second shielding conductive layers 280 separated from the upper pad 265 and arranged at both sides of the upper pad 265. The second shielding conductive layer 280 may include, for example, a metal. However, a material of the second shielding conductive layer 280 is not limited to a metal. For example, the second shielding conductive layer 280 may be formed of doped polysilicon.

In FIG. 4A, the second shielding conductive layer 280 may extend in a direction of entering the first horizontal direction (X direction) (for example, extending through the illustrated figure) and may be connected to a ground pad at any one end. Accordingly, the second shielding conductive layer 280 may be connected to the ground. As such, by arranging the second shielding conductive layers 280, which is connected to the ground, at both sides of the upper pad 265, coupling noise between upper pads 270 adjacent in a horizontal direction may be minimized or reduced. Herein, the horizontal direction may indicate a direction on a plane that is perpendicular to the third direction (the Z direction).

Referring to FIG. 4B, in the image sensor 1000 according to some example embodiments, the 1st-chip 100 and the 2nd-chip 200 may be bonded to each other by Cu—Cu bonding or HB. Particularly, the first pad 156 of the first wiring layer 150 in the 1st-chip 100 and the upper pad 265 in the 2nd-chip 200 may be Cu—Cu bonded to each other, and a first adhesive layer 158 in the 1st-chip 100 and the second adhesive layer 277 in the 2nd-chip 200 may be bonded to each other. As described above, the first adhesive layer 158 may be included as a portion of the first interlayer insulating layer 152, and the second adhesive layer 277 and the passivation layer 275 may be included as a portion of the upper insulating layer 270.

The first pad 156 in the 1st-chip 100 may be connected to the TG 120, the FD region 130, or the like via the first wiring 154. The upper pad 265 in the 2nd-chip 200 may be connected to the SF 220 and may also be connected to a source/drain region of the RG 230 through electrode 260 and the second wiring 254. In addition, the upper pad 265 in the 2nd-chip 200 may be connected to the second pad 256 via the through electrode 260 and the second wiring 254. Accordingly, the upper pad 265 in the 2nd-chip 200 may be connected to the third wiring 334 by Cu—Cu bonding between the second pad 256 and the third pad 336 in the 3rd-chip 300.

In the image sensor 1000 according to some example embodiments, the 1st-chip 100 may include first shielding conductive layers 180 separated from the first pad 156 and arranged at both sides of the first pad 156. In addition, the 2nd-chip 200 may include second shielding conductive layers 280 separated from the upper pad 265 and arranged at both sides of the upper pad 265. The first and second shielding conductive layers 180 and 280 may include, for example, a metal. However, a material of the first and second shielding conductive layers 180 and 280 is not limited to a metal.

In FIG. 4B, the first and second shielding conductive layers 180 and 280 may extend in a direction of entering the first horizontal direction (X direction) (for example, extending through the illustrated figure) and may be connected to a ground pad at any one end. Accordingly, each of the first and second shielding conductive layers 180 and 280 may be connected to the ground. As such, by arranging the first and second shielding conductive layers 180 and 280 at both sides of the first pad 156 and the upper pad 265, respectively, coupling noise between first pads 156, upper pads 265, or Cu—Cu bonding structures adjacent in the horizontal direction may be minimized or reduced. According to some example embodiments, any one of or both the first and second shielding conductive layers 180 and 280 may be omitted.

In the image sensor 1000 according to some example embodiments, the first shielding conductive layer 180 and the second shielding conductive layer 280 corresponding thereto may be bonded to each other. For example, when the first and second shielding conductive layers 180 and 280 include Cu, the first and second shielding conductive layers 180 and 280 may be Cu—Cu bonded to each other. Because each of the first and second shielding conductive layers 180 and 280 is connected to the ground, it is not needed to accurately align and bond the first shielding conductive layer 180 and the second shielding conductive layer 280 to each other. Therefore, the first shielding conductive layer 180 and the second shielding conductive layer 280 may overlap partially or not at all in a worst case in the third direction (the Z direction). Even when the first and second shielding conductive layers 180 and 280 are not aligned, each of the first and second shielding conductive layers 180 and 280 is connected to the ground, and thus, a coupling noise prevention function may not be largely affected, and may function as one of ordinary skill in the art would understand.

Figure 5A:
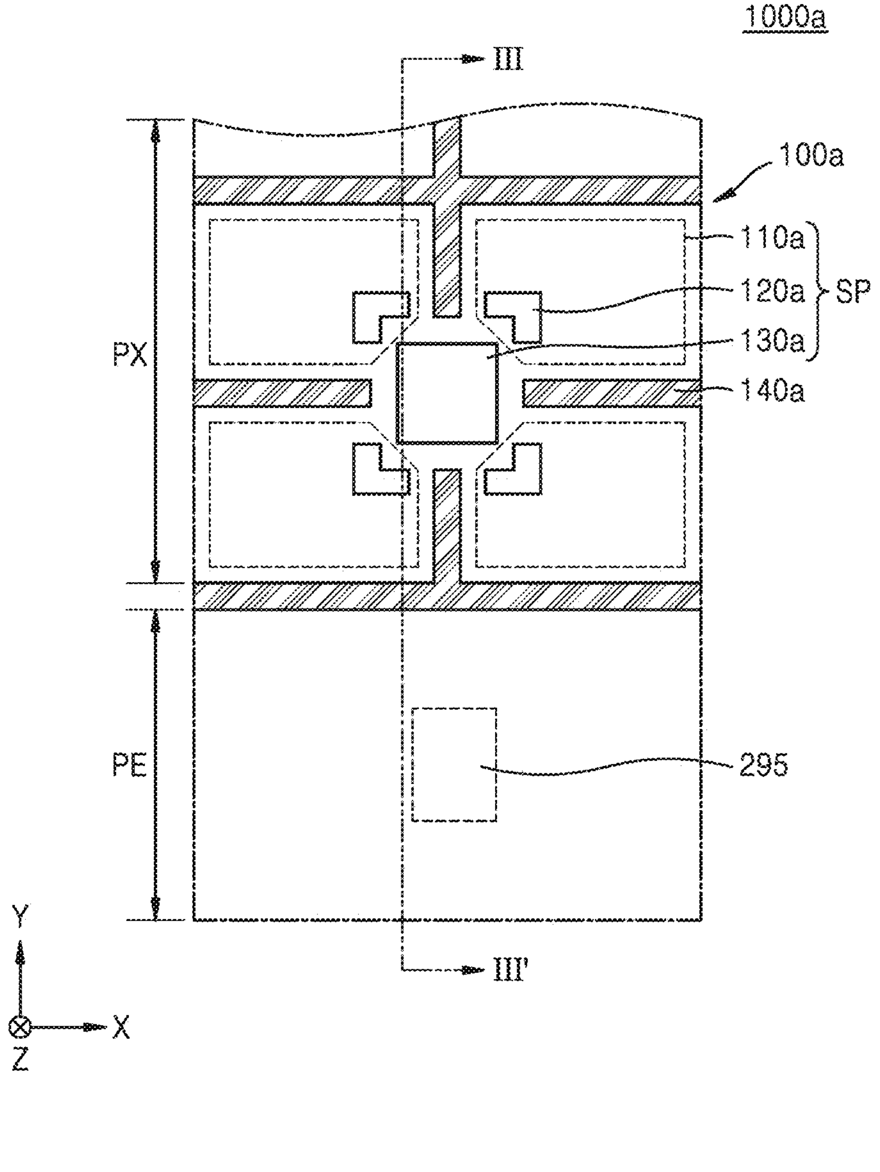
FIGS. 5A and 5B are respectively a top view and a cross-sectional view of a three-layered stacked image sensor according to some example embodiments.
Figure 5B:
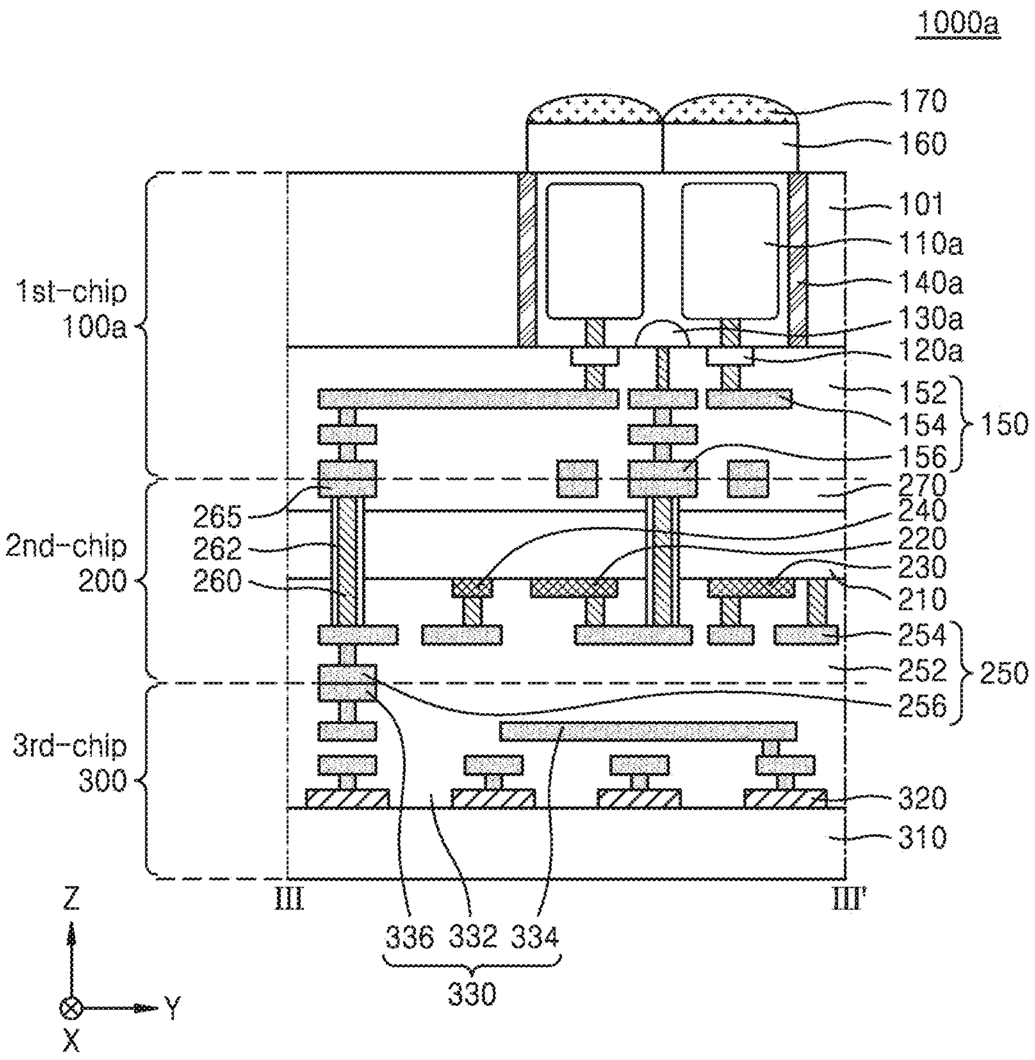

FIGS. 5A and 5B are respectively a top view and a cross-sectional view of a three-layered stacked image sensor 1000*a* according to some example embodiments. FIG. 5B is a cross-sectional view taken along line III-III' of FIG. 5A. A description made with reference to FIGS. 1A to 4B is simply repeated or omitted.

Referring to FIGS. 5A and 5B, the three-layered stacked image sensor (hereinafter, simply "image sensor") 1000*a* according to some example embodiments may differ from the image sensor 1000 of FIG. 1B in that the former has a shared pixel (SP) structure. Particularly, the image sensor 1000*a* according to some example embodiments may be, for example, a CIS and include three semiconductor chips, e.g., a 1st-chip 100*a*, a 2nd-chip 200, and a 3rd-chip 300. The 2nd-chip 200 and the 3rd-chip 300 may be the same or substantially the same as the 2nd-chip 200 and the 3rd-chip 300 in the image sensor 1000 of FIG. 1C except that a wiring connection relationship is slightly changed in correspondence to a structure of the 1st-chip 100*a*.

In the image sensor 1000*a* according to some example embodiments, the 1st-chip 100*a* may include an SP structure. An SP may have a structure in which four PDs 110*a* share an FD region 130*a* at the center thereof. In addition, the SP may generally have a quadrangular structure in which two PDs 110*a* are adjacent to each other in a first direction (an X direction), and two PDs 110*a* are adjacent to each other in a second direction (a Y direction). In the 1st-chip 100, the SP may be arranged in a two-dimensional array structure in the first direction (the X direction) and the second direction (the Y direction).

In addition, four TGs 120*a* respectively corresponding to the four PDs 110*a* are at a center portion inside the SP, and the four TGs 120*a* may share the FD region 130*a* as a common source/drain region. By arranging the TGs 120*a* in the structure described above, charges generated in the four PDs 110*a* may be accumulated in the FD region 130*a* through the four TGs 120*a*.

In FIG. 5A, the FD region 130*a* may have a quadrangular shape in a top view. In addition, a protrusion portion of the TG 120*a* may have an L shape surrounding the FD region 130*a* in a top view. However, planar shapes of the FD region 130*a* and the protrusion portion of the TG 120*a* are not limited thereto. For example, the FD region 130*a* may have a circular shape, an oval shape, or another polygonal shape other than the quadrangular shape in a top view. In addition, the protrusion portion of the TG 120*a* may have any of various planar shapes, such as a triangular shape or a trapezoidal shape, in correspondence to the shape of the FD region 130*a*.

As shown in FIG. 5B, each of the four TGs 120*a* may be connected to a corresponding PD 110*a* via an embedded portion of the TG 120*a* and connected to the first wiring 154 of the first wiring layer 150 via a protrusion portion of the TG 120*a*. In addition, the FD region 130*a* may be connected to the first wiring 154 of the first wiring layer 150 and connected to the SF 220 and the source/drain region of the RG 230 in the 2nd-chip 200 via the first pad 156, the upper pad 265, and the through electrode 260.

Although an SP structure in which four PDs 110*a* share one FD region 130*a* has been described, the SP structure in the 1st-chip 100*a* is not limited thereto. For example, the SP in the 1st-chip 100*a* is not limited to four PDs 110*a*, and two PDs, eight PDs, or other various numbers of PDs may share one FD region.

FIGS. 6 and 7A to 7H are a flowchart schematically illustrating a method of manufacturing a three-layered stacked image sensor, according to some example embodiments, and cross-sectional views corresponding to respective operations. A description below is made with reference to FIG. 1C together, and a description made with reference to FIGS. 1A to 5B is simply repeated or omitted.

Figure 6:
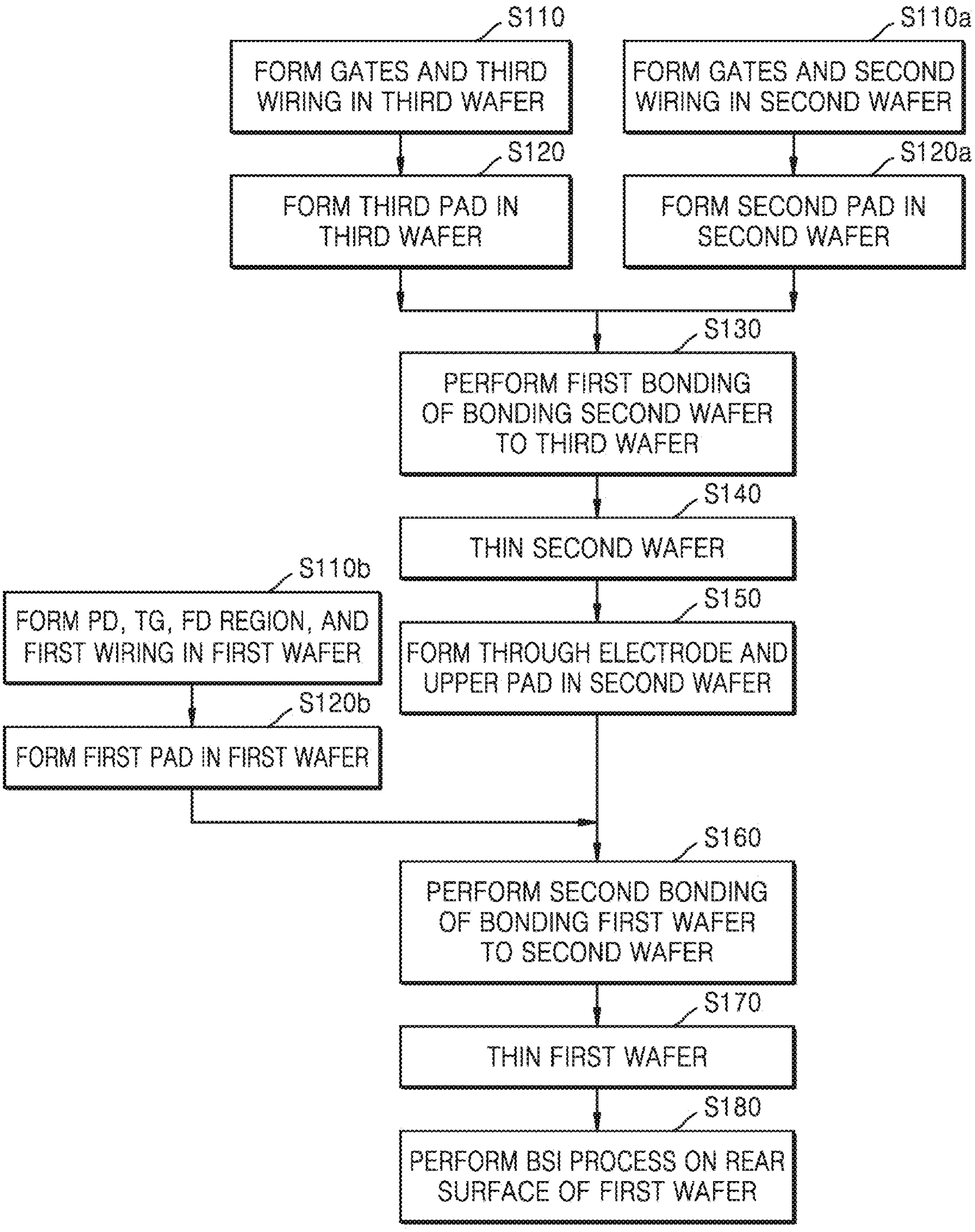
FIGS. 6 and 7A to 7H are a flowchart schematically illustrating a method of manufacturing a three-layered stacked image sensor, according to some example embodiments, and cross-sectional views corresponding to respective operations.
Figure 7A:
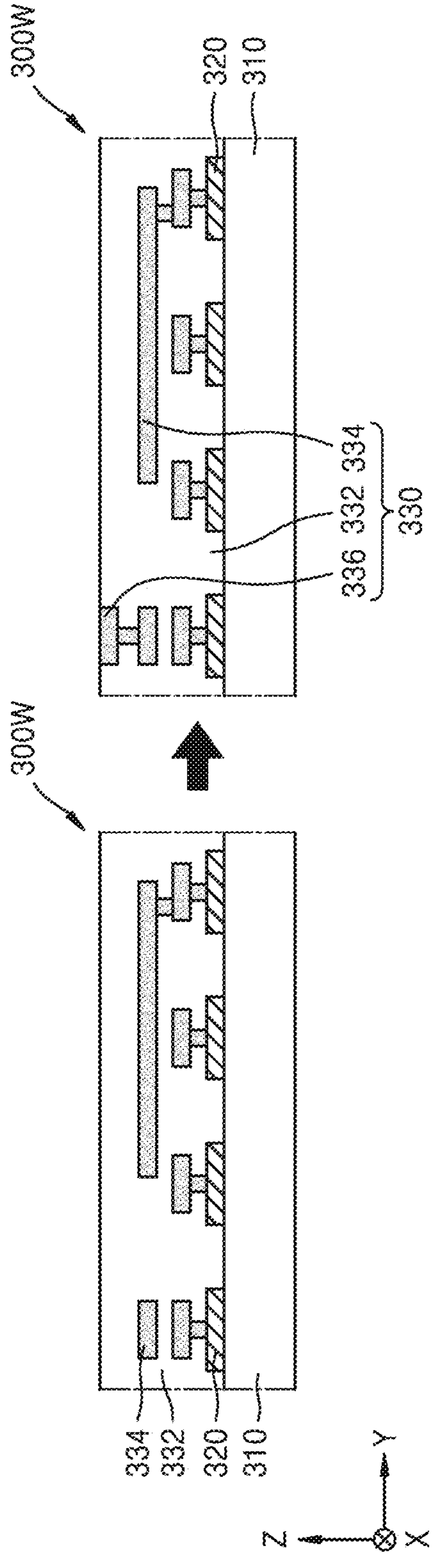

Referring to FIGS. 6 and 7A, in the method of manufacturing a three-layered stacked image sensor (hereinafter, simply "image sensor manufacturing method") according to some example embodiments, first, the gates 320 and the third wiring 334 may be formed in a third wafer 300W in operation S110. The gates 320 may constitute TRs together with active regions of the third substrate 310. These TRs may constitute logic circuits in the 3rd-chip 300. The third wiring 334 may include horizontal wirings and a vertical via in the third interlayer insulating layer 332. The gates 320 may be connected to the horizontal wirings via the vertical via.

Next, the third pad 336 may be formed on the upper surface of the third interlayer insulating layer 332 in operation S120. The third pad 336 may be connected to the third wiring 334 by passing through an upper portion of the third interlayer insulating layer 332. According to some example embodiments, an adhesive layer may be formed on the upper surface of the third interlayer insulating layer 332, and the third pad 336 may pass through the adhesive layer and the upper portion of the third interlayer insulating layer 332. An upper surface of the third pad 336 may be exposed from the upper surface of the third interlayer insulating layer 332. By forming the third pad 336, the third wiring layer 330 of the third wafer 300W may be completed.

Figure 7B:
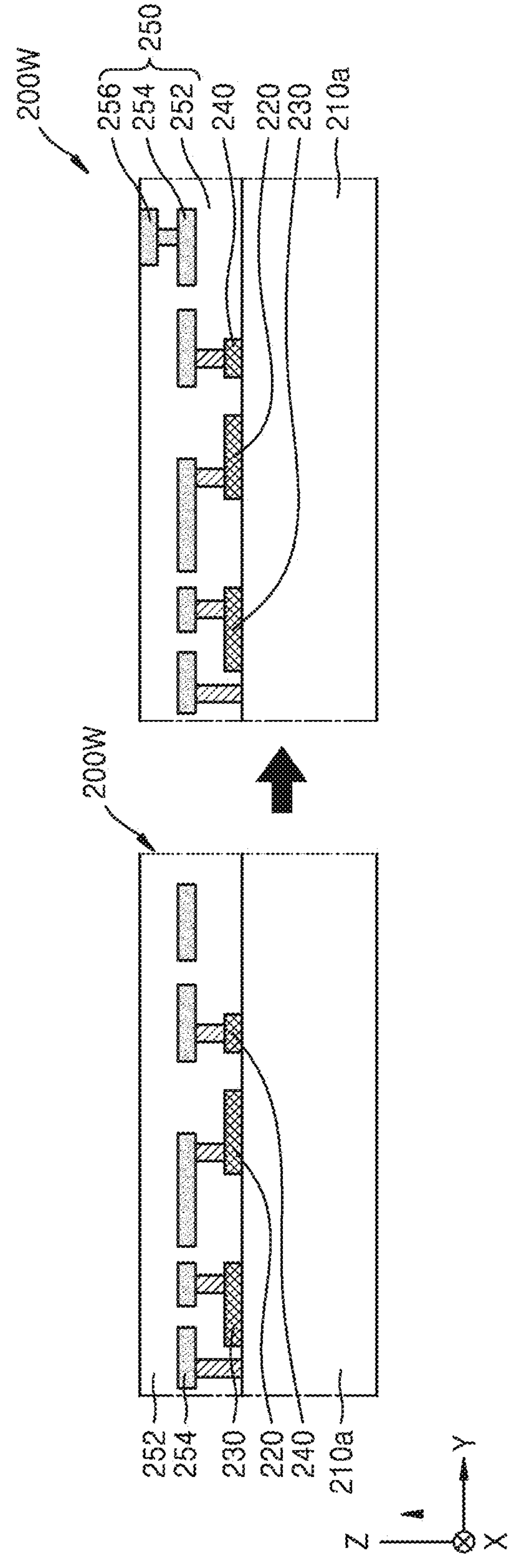

Referring to FIGS. 6 and 7B, next, the SF 220, the RG 230, the SEL 240, and the second wiring 254 may be formed in the second wafer 200W in operation S110*a*. When the SF 220, the RG 230, and the SEL 240 are formed, other gates may be formed together. The SF 220, the RG 230, and the SEL 240 may constitute a source follower TR, a reset TR, and a select TR together with active regions in a second substrate 210*a*, respectively. The second wiring 254 may include horizontal wirings and a vertical via in the second interlayer insulating layer 252. The SF 220, the RG 230, the SEL 240, and the like may be connected to the horizontal wirings via the vertical via.

Next, the second pad 256 may be formed on an upper surface of the second interlayer insulating layer 252 in operation S120*a*. The second pad 256 may be connected to the second wiring 254 by passing through an upper portion of the second interlayer insulating layer 252. According to some example embodiments, an adhesive layer may be formed on the upper surface of the second interlayer insulating layer 252, and the second pad 256 may pass through the adhesive layer and the upper portion of the second interlayer insulating layer 252. An upper surface of the second pad 256 may be exposed from the upper surface of the second interlayer insulating layer 252. By forming the second pad 256, the second wiring layer 250 of the second wafer 200W may be completed.

In some example embodiments, the forming of the gates 320 and the third wiring layer 330 of the third wafer 300W and the forming of the SF 220, the RG 230, the SEL 240, and the second wiring layer 250 of the second wafer 200W may be performed in parallel. In other words, a process on the third wafer 300W and a process on the second wafer 200W may be individually performed.

Figure 7C:
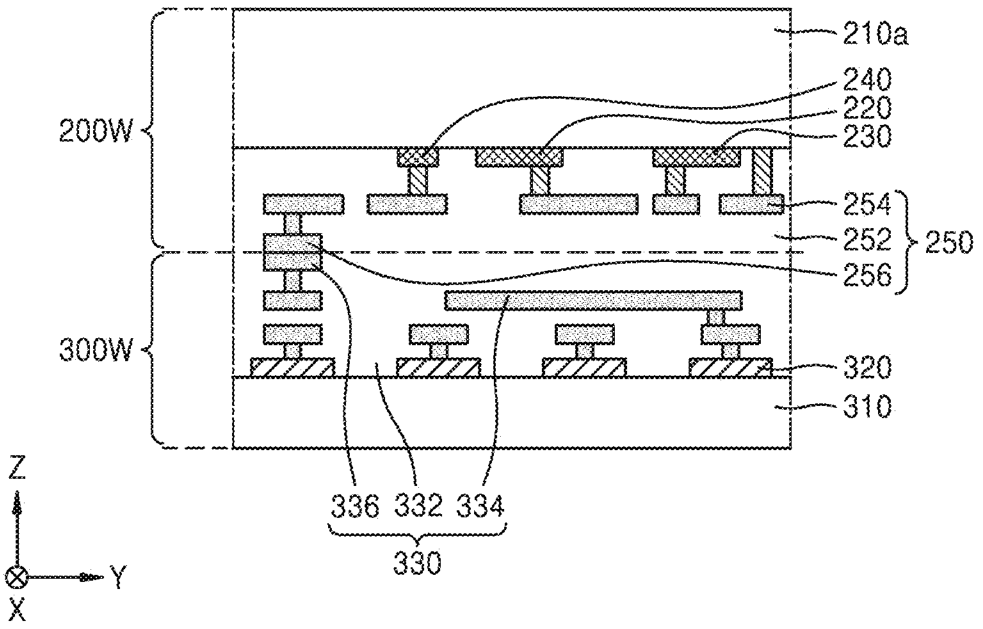

Referring to FIGS. 6 and 7C, next, first bonding of bonding the second wafer 200W to the third wafer 300W such that the second wiring layer 250 of the second wafer 200W faces the third wiring layer 330 of the third wafer 300W may be performed in operation S130. In the first bonding, the second pad 256 of the second wiring layer 250 and the third pad 336 of the third wiring layer 330 may be Cu—Cu bonded to each other. In addition, the second interlayer insulating layer 252 of the second wiring layer 250 and the third interlayer insulating layer 332 of the third wiring layer 330 may be bonded to each other.

Figure 7D:
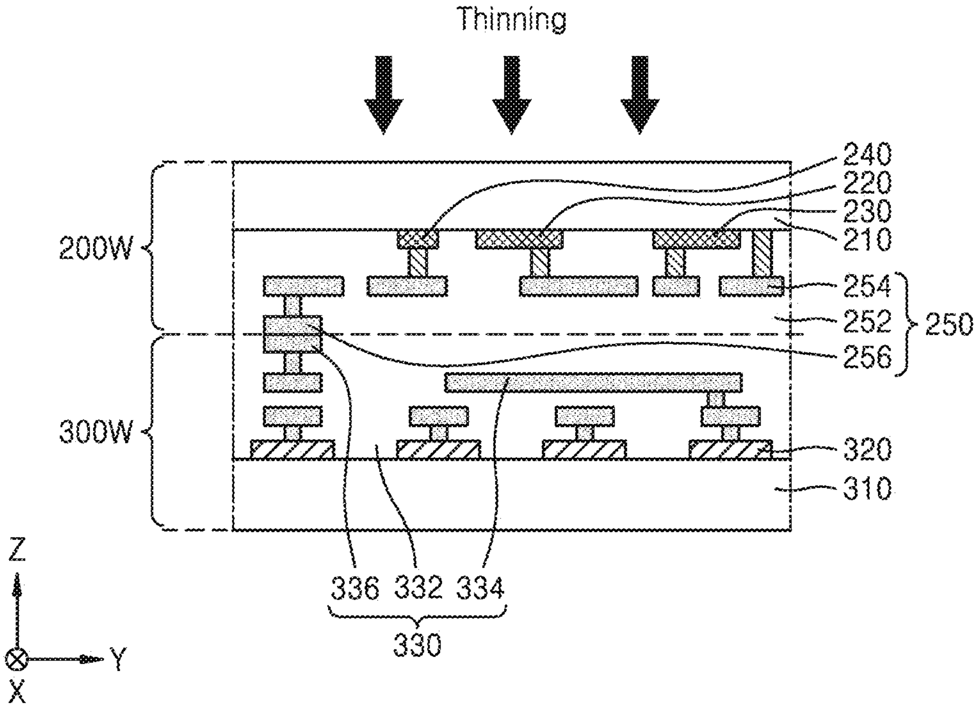

Referring to FIGS. 6 and 7D, after the first bonding, the second wafer 200W may be thinned through a thinning process on the second wafer 200W in operation S140. The thinning process may indicate a process of removing a rear surface portion of the second substrate 210*a* through grinding or chemical mechanical polishing (CMP). Herein, a rear surface of the second substrate 210*a* may indicate a surface opposite to a front surface of the second substrate 210*a* on which the second wiring layer 250 is disposed. The second substrate 210 thinned through the thinning process may be formed.

Figure 7E:
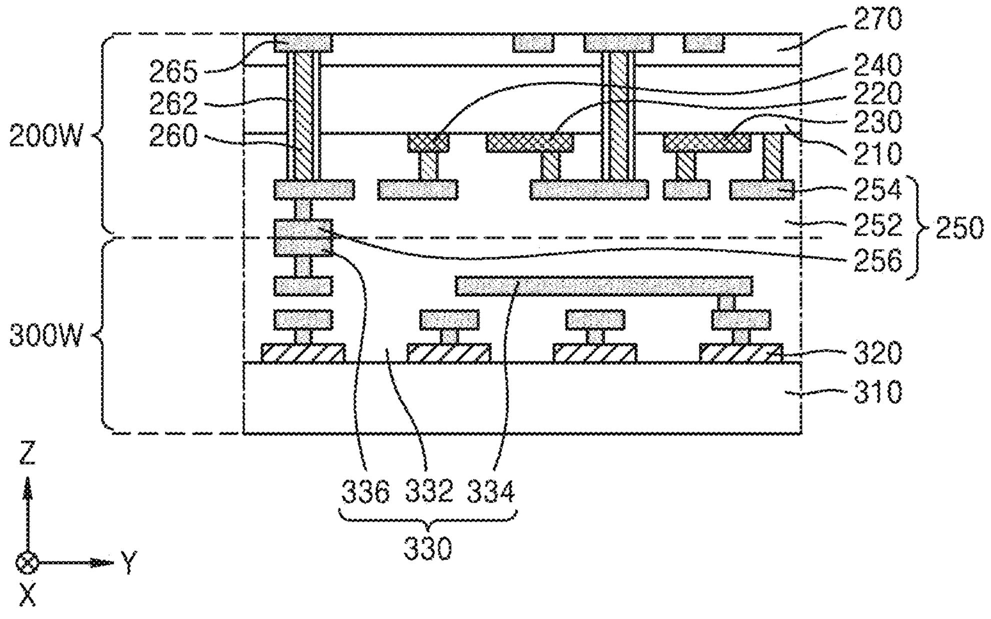

Referring to FIGS. 6 and 7E, next, the through electrode 260 and the upper pad 265 may be formed in the second wafer 200W in operation S150. The through electrode 260 may extend by passing through an upper portion of the second interlayer insulating layer 252, the second substrate 210, and the upper insulating layer 270. The lower surface of the through electrode 260 may be connected to the second wiring 254 of the second wiring layer 250, and the upper surface thereof may be connected to the upper pad 265. The side surface of the through electrode 260 may be surrounded by the sidewall insulating layer 262. As described above, the upper portion, e.g., the via head FC, of the through electrode 260 may have a calyx shape. A process of forming the through electrode 260 is described in more detail with reference to FIGS. 8A to 8F.

The upper pad 265 may be formed on the through electrode 260. However, although the upper pad 265 is formed in a structure passing through the second adhesive layer 277 and the passivation layer 275 as shown in FIG. 4A, FIG. 7E shows that the second adhesive layer 277 and the passivation layer 275 are included in the upper insulating layer 270. In addition, when the upper pad 265 is formed, second shielding conductive layers 280 separated from the upper pad 265 may be formed together at both sides of the upper pad 265.

Figure 7F:
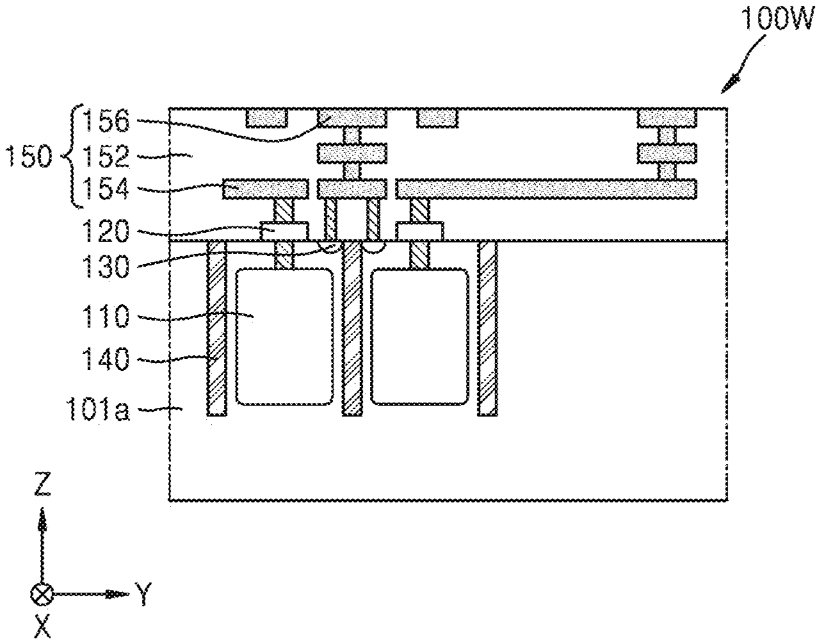

Referring to FIGS. 6 and 7F, next, the PD 110, the TG 120, the FD region 130, and the first wiring 154 may be formed in a first wafer 100W in operation S110*b*. The TG 120 may constitute a transfer TR together with an active region, e.g., the FD region 130, of a first substrate 101*a*. The first wiring 154 may include horizontal wirings and a vertical via in the first interlayer insulating layer 152. The TG 120 and the FD region 130 may be connected to the horizontal wirings via the vertical via.

Next, the first pad 156 may be formed on an upper surface of the first interlayer insulating layer 152 in operation S120*b*. The first pad 156 may be connected to the first wiring 154 by passing through an upper portion of the first interlayer insulating layer 152. According to some example embodiments, an adhesive layer may be formed on the upper surface of the first interlayer insulating layer 152, and the first pad 156 may pass through the adhesive layer and the upper portion of the first interlayer insulating layer 152. An upper surface of the first pad 156 may be exposed from the upper surface of the first interlayer insulating layer 152. By forming the first pad 156, the first wiring layer 150 of the first wafer 100W may be completed.

In some example embodiments, the forming of the PD 110, the TG 120, the FD region 130, and the first wiring layer 150 of the first wafer 100W and the aforementioned processes on the second wafer 200W and the third wafer 300W may be performed in parallel. In other words, operations S110*a* to S150, and operations S110*b* and S120*b* may be individually performed.

Figure 7G:
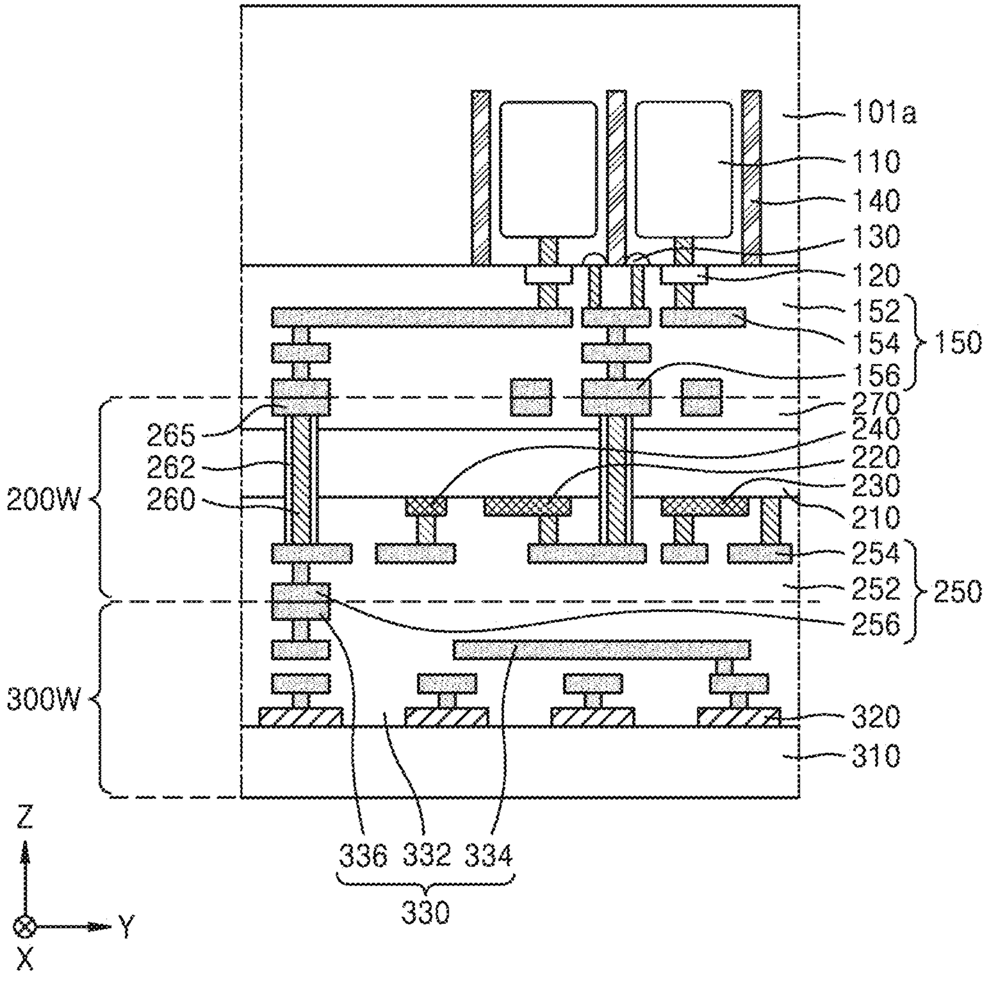

Referring to FIGS. 6 and 7G, next, second bonding of bonding the first wafer 100W to the second wafer 200W such that the first wiring layer 150 of the first wafer 100W faces the upper insulating layer 270 of the second wafer 200W may be performed in operation S160. In the second bonding, the first pad 156 of the first wiring layer 150 and the upper pad 265 of the second wafer 200W may be Cu—Cu bonded to each other. In addition, the first interlayer insulating layer 152 of the first wiring layer 150 and the upper insulating layer 270 of the second wafer 200W may be bonded to each other. Although not shown in FIG. 7G, the upper insulating layer 270 may include the second adhesive layer 277 and the passivation layer 275. In addition, the first interlayer insulating layer 152 may include the first adhesive layer 158. Accordingly, bonding between the first interlayer insulating layer 152 and the upper insulating layer 270 may indicate bonding between the first adhesive layer 158 and the second adhesive layer 277.

Figure 7H:
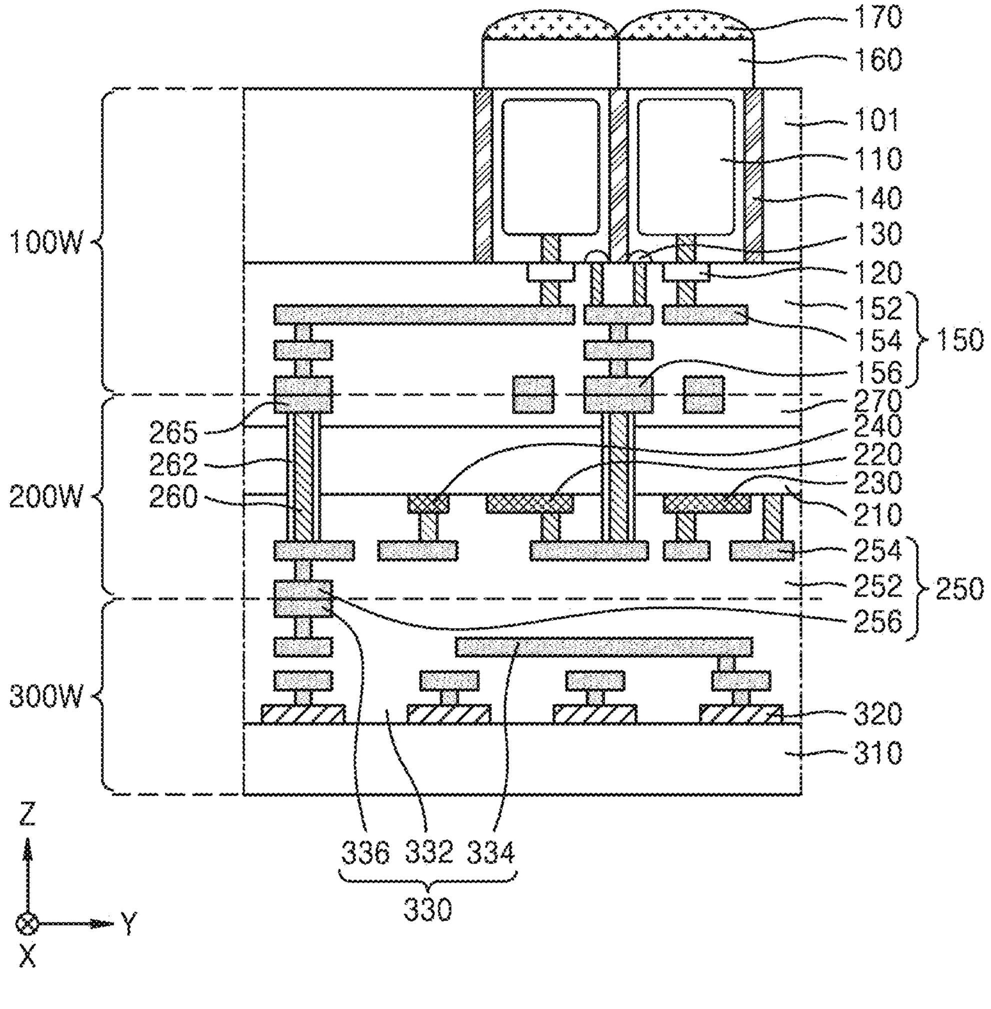

Referring to FIGS. 6 and 7H, after the second bonding, the first wafer 100W may be thinned through a thinning process on the first wafer 100W in operation S170. The thinning process may indicate a process of removing a rear surface portion of the first substrate 101*a* through grinding or CMP. Herein, a rear surface of the first substrate 101*a* may indicate a surface opposite to a front surface of the first substrate 101*a* on which the first wiring layer 150 is disposed. The first substrate 101 thinned through the thinning process may be formed.

Next, a backside illumination (BSI) process may be performed on a rear surface of the first wafer 100W, e.g., a rear surface of the first substrate 101, in operation S180. The BSI process may indicate a process of forming the color filters 160, the microlens 170, and the like on the rear surface of the first substrate 101.

Next, the bonded first wafer 100W, second wafer 200W, and third wafer 300W may be divided into a plurality of stacked structures by individualizing the same to a chip level through a sawing process. Each of the plurality of stacked structures may correspond to the image sensor 1000 of FIG. 1C. The image sensor 1000 according to some example embodiments may have a BSI structure because the color filters 160 and the microlens 170 are on the rear surface of the first substrate 101.

FIGS. 8A to 8F are cross-sectional views illustrating in more detail a process, in FIG. 7E, of forming the through electrode 260. A description below is made with reference to FIG. 1C together, and a description made with reference to FIGS. 1A to 7H is simply repeated or omitted.

Figure 8A:
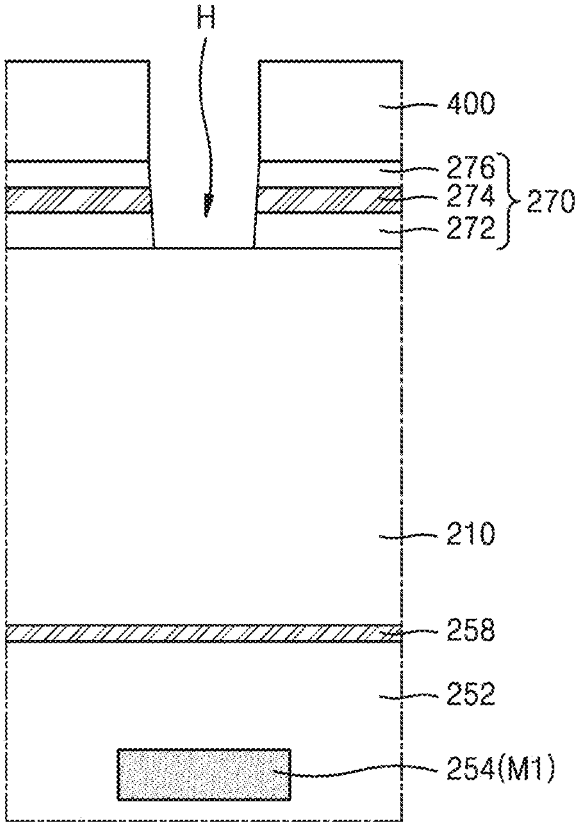
FIGS. 8A to 8F are cross-sectional views illustrating in more detail a process of FIG. 7E of forming a through electrode according to some example embodiments.

Referring to FIG. 8A, first, the upper insulating layer 270 may be formed on the second substrate 210 thinned through a thinning process. The upper insulating layer 270 may act as a hard mask in an etching process on the second substrate 210 and, after the etching process, function to protect the second substrate 210 together with the passivation layer 275 (see FIG. 4A).

The upper insulating layer 270 may include, for example, the first insulating layer 272, the second insulating layer 274, and the third insulating layer 276. Herein, the first insulating layer 272 and the third insulating layer 276 may include an oxide layer, and the second insulating layer 274 may include a nitride layer. However, materials of the first insulating layer 272, the second insulating layer 274, and the third insulating layer 276 are not limited to the materials described above. In addition, the number of layers of the upper insulating layer 270 is not limited to three and may be one, two, or four or more.

Next, a photoresist (PR) pattern 400 may be formed on the upper insulating layer 270. The PR pattern 400 may be formed by applying a PR on the upper insulating layer 270 by spin coating or the like and performing an exposure process, a development process, and the like on the PR.

Next, a through hole H exposing the second substrate 210 therethrough may be formed in the upper insulating layer 270 by using the PR pattern 400 as an etching mask to etch the upper insulating layer 270. The through hole H may have a wide upper portion and a narrow lower portion because of the characteristic of an etching process. However, by precisely controlling the etching process, the upper and lower portions of the through hole H may have the same or substantially the same width.

Figure 8B:
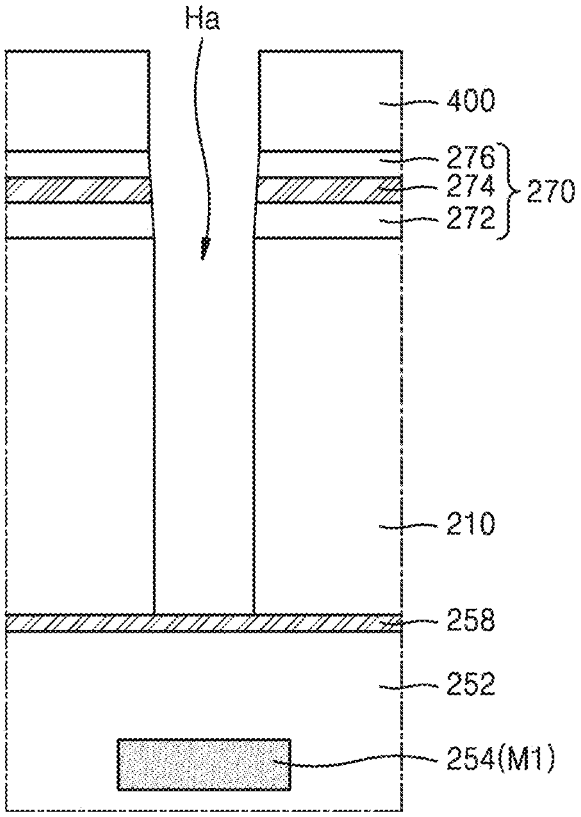

Referring to FIG. 8B, after forming the through hole H in the upper insulating layer 270, the second substrate 210 may be etched by using the PR pattern 400 and the upper insulating layer 270 as an etching mask to expose the etching stop layer 258 on the lower surface of the second substrate 210. By etching the second substrate 210, a through hole Ha may extend to the etching stop layer 258 by passing through the second substrate 210 in the third direction (the Z direction). The etching stop layer 258 may include, for example, a nitride layer. However, the etching stop layer 258 is not limited to the nitride layer.

Figure 8C:
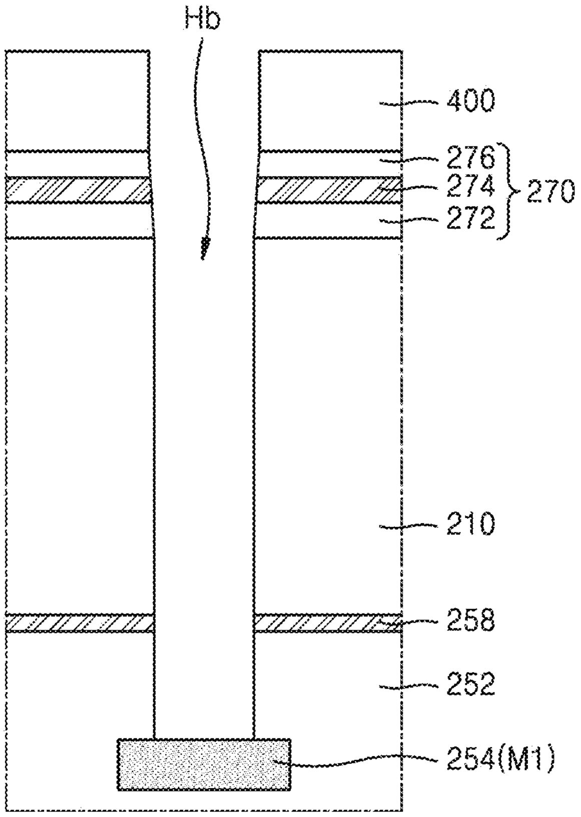

Referring to FIG. 8C, next, the etching stop layer 258 and the second interlayer insulating layer 252 may be etched by using the PR pattern 400 and the upper insulating layer 270 as an etching mask to expose the second wiring 254 in the second interlayer insulating layer 252. The second wiring 254 may correspond to, for example, an M1 metal. By etching the etching stop layer 258 and the second interlayer insulating layer 252, a through hole Hb may extend to the second wiring 254 by passing through the etching stop layer 258 and the second interlayer insulating layer 252 in the third direction (the Z direction).

Figure 8D:
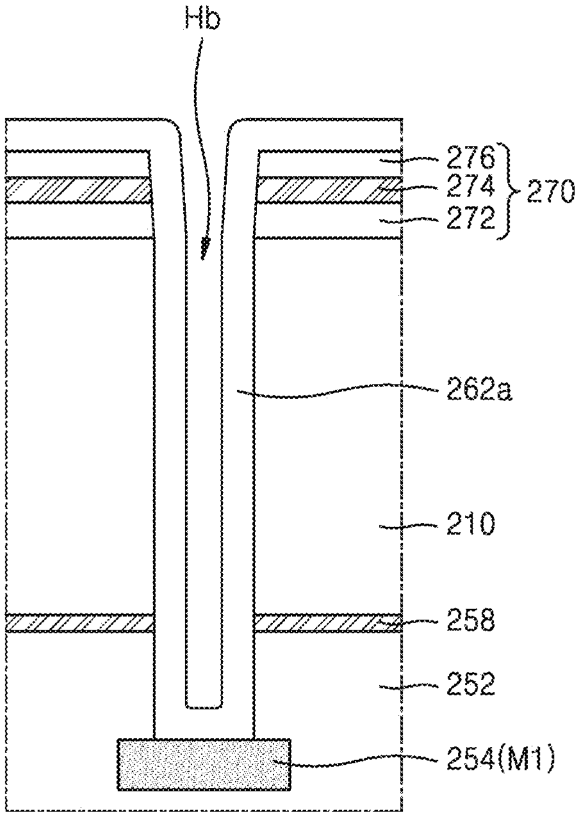

Referring to FIG. 8D, the PR pattern 400 remaining after forming the through hole Hb may be removed. The PR pattern 400 may be removed by, for example, an ashing/strip process. After removing the PR pattern 400, a sidewall insulating layer 262*a* covering a bottom surface and a sidewall of the through hole Hb and the upper surface of the upper insulating layer 270 may be formed. The sidewall insulating layer 262*a* may include, for example, an oxide layer and may be formed as a single layer. However, a material of the sidewall insulating layer 262*a* is not limited to the oxide layer. Alternatively, the sidewall insulating layer 262*a* may be formed as multiple layers.

Figure 8E:
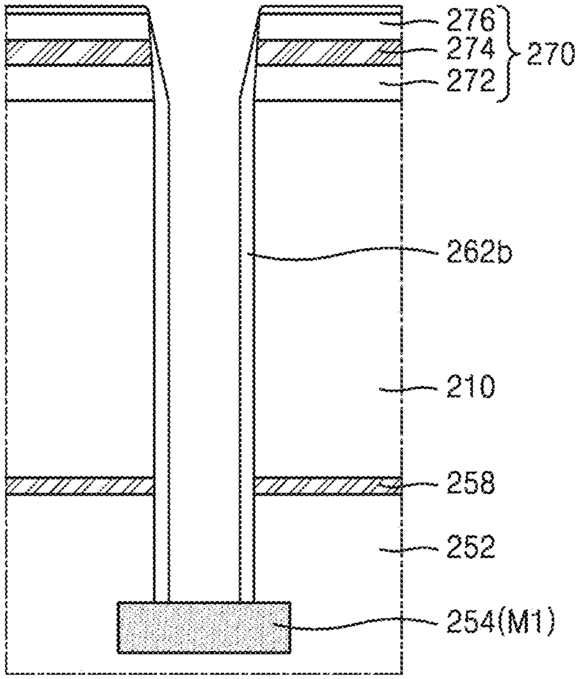

Referring to FIG. 8E, next, the sidewall insulating layer 262*a* on the bottom surface of the through hole Hb and the sidewall insulating layer 262*a* on the upper surface of the upper insulating layer 270 may be removed by an etch-back process. After the etch-back process, the second wiring 254 may be exposed again through the bottom surface of the through hole Hb. In addition, after the etch-back process, a sidewall insulating layer 262*b* on the upper surface of the upper insulating layer 270 may be fully or partially removed.

For a sidewall portion of the through hole Hb, in the etch-back process, a portion of the sidewall insulating layer 262*b* corresponding to the upper insulating layer 270 close to an entrance portion of the through hole Hb may be relatively much removed, and a portion of the sidewall insulating layer 262*b* corresponding to the second substrate 210 and the second interlayer insulating layer 252 may be hardly removed. Therefore, the portion of the sidewall insulating layer 262*b* corresponding to the upper insulating layer 270 may be thinner than the portion of the sidewall insulating layer 262*b* corresponding to the second substrate 210 and the second interlayer insulating layer 252. In addition, the portion of the sidewall insulating layer 262*b* corresponding to the upper insulating layer 270 may be much removed as close to the entrance portion of the through hole Hb and little removed as away therefrom in the etch-back process. Accordingly, an upper portion of the through hole Hb, e.g., a portion of the through hole Hb corresponding to the upper insulating layer 270, may have a calyx shape. That is, as shown in FIG. 8E, a cross-section of the upper portion of the through hole Hb may have an inverted trapezoidal shape.

Figure 8F:
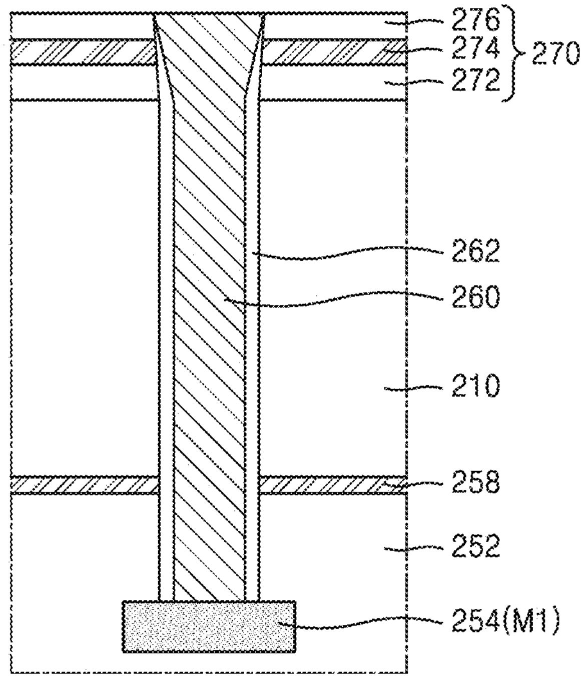

Referring to FIG. 8F, next, a metal-fill process of filling the through hole Hb with a metal material may be performed. In the metal-fill process, a metal material may be formed on the upper surface of the upper insulating layer 270 or on the sidewall insulating layer 262*b* on the upper surface of the upper insulating layer 270. Accordingly, a CMP process of removing the metal material on the upper surface of the upper insulating layer 270 may be performed. The through electrode 260 may be completed by the CMP process. Meanwhile, in the CMP process, the sidewall insulating layer 262 remaining on the upper surface of the upper insulating layer 270 may be fully removed.

The upper portion, e.g., the via head FC surrounded by the upper insulating layer 270, of the through electrode 260 may have a calyx shape in correspondence to the shape of the upper portion of the through hole Hb described above. In other words, the via head FC of the through electrode 260 may have a wide upper surface and a narrow lower portion and also have a cross-section of an inverted trapezoidal structure.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While the inventive concepts have been particularly shown and described with reference to example embodiments thereof, it will be understood that various changes in form and details may be made therein without departing from the spirit and scope of the following claims.

What is claimed is:

1. A three-layered stacked image sensor comprising:

an upper chip comprising a plurality of pixels arranged in a two-dimensional array structure, and a first wiring layer beneath the plurality of pixels, each of the plurality of pixels comprising a photodiode, a transfer gate, and a floating diffusion region;

an intermediate chip comprising a source follower gate, a select gate, and a reset gate corresponding to each of the plurality of pixels, a first silicon layer at an upper portion of the intermediate chip, and a second wiring layer at a lower portion of the intermediate chip; and a lower chip comprising an image sensor processor, a third wiring layer at an upper portion of the lower chip, and a second silicon layer at a lower portion of the lower chip, the upper chip, the intermediate chip, and the lower chip sequentially stacked from a top, a first pad of the first wiring layer and an upper pad of the intermediate chip bonded to each other, a second pad of the second wiring layer and a third pad of the third wiring layer bonded to each other, the upper pad on a through electrode extending from the second wiring layer through the first silicon layer, and a cross-section of an upper portion of the through electrode having an inverted trapezoidal structure.

2. The three-layered stacked image sensor of claim 1, wherein the through electrode connects the upper pad, bonded to the first pad connected to the floating diffusion region, to a first wiring of the second wiring layer connected to the source follower gate.

3. The three-layered stacked image sensor of claim 1, wherein the intermediate chip further comprises an upper insulating layer on the first silicon layer, and the through electrode extends by passing through the first silicon layer and the upper insulating layer and the through electrode has the inverted trapezoidal structure at a portion corresponding to the upper insulating layer.

4. The three-layered stacked image sensor of claim 3, wherein the upper insulating layer has a multi-layer structure.

5. The three-layered stacked image sensor of claim 3, further comprising a sidewall insulating layer between the through electrode and the first silicon layer and between the through electrode and the upper insulating layer.

6. The three-layered stacked image sensor of claim 5, wherein the sidewall insulating layer between the through electrode and the first silicon layer is thicker than the sidewall insulating layer between the through electrode and the upper insulating layer.

7. The three-layered stacked image sensor of claim 1, further comprising first shielding conductive layers separated from the first pad and at both sides of the first pad, wherein each of the first shielding conductive layers is connected to ground.

8. The three-layered stacked image sensor of claim 7, further comprising second shielding conductive layers separated from the upper pad and at both sides of the upper pad, wherein each of the second shielding conductive layers is connected to ground.

9. The three-layered stacked image sensor of claim 8, wherein ones of the first shielding conductive layers and respective ones of the second shielding conductive layers overlap each other at least partially in a vertical direction.

10. The three-layered stacked image sensor of claim 1, wherein the plurality of pixels are separated from each other by a deep trench isolation, and the upper chip further comprises a color filter and a microlens on each of the plurality of pixels.

11. A three-layered stacked image sensor comprising:

a first chip at a top position and comprising a photodiode, a transfer gate, a floating diffusion region, and a first wiring layer;

a second chip at an intermediate position and comprising a source follower gate, a select gate, a reset gate, and a second wiring layer; and a third chip at a bottom position and comprising an image sensor processor and a third wiring layer, the second chip comprising a silicon layer on the second wiring layer, an upper pad on the silicon layer, and a through electrode extending from the second wiring layer through the silicon layer and connected to the upper pad, a first pad of the first wiring layer and the upper pad bonded to each other, a second pad of the second wiring layer and a third pad of the third wiring layer bonded to each other, and a cross-section of an upper portion of the through electrode bonded to the upper pad having an inverted trapezoidal structure.

12. The three-layered stacked image sensor of claim 11, wherein the second chip further comprises an upper insulating layer on the silicon layer, and the through electrode extends by passing through the silicon layer and the upper insulating layer and the through electrode has the inverted trapezoidal structure at a portion corresponding to the upper insulating layer.

13. The three-layered stacked image sensor of claim 12, further comprising a sidewall insulating layer between the through electrode and the silicon layer and between the through electrode and an upper insulating layer, wherein the sidewall insulating layer between the through electrode and the silicon layer is thicker than the sidewall insulating layer between the through electrode and the upper insulating layer.

14. The three-layered stacked image sensor of claim 11, further comprising:

first shielding conductive layers separated from the first pad and at both sides of the first pad; and second shielding conductive layers separated from the upper pad and at both sides of the upper pad, wherein each of the first shielding conductive layers and the second shielding conductive layers is connected to ground.

15. The three-layered stacked image sensor of claim 11, wherein the first chip further comprises a color filter and a microlens on the first chip corresponding to the photodiode.

16. A three-layered stacked image sensor comprising:

an upper chip comprising a plurality of pixels arranged in a two-dimensional array structure, a first wiring layer beneath the plurality of pixels, and a color filter and a microlens stacked on each of the plurality of pixels, each of the plurality of pixels comprising a photodiode, a transfer gate, and a floating diffusion region;

an intermediate chip comprising a source follower gate, a select gate, and a reset gate corresponding to each of the plurality of pixels, a first silicon layer and an upper insulating layer at an upper portion of the intermediate chip, and a second wiring layer at a lower portion of the intermediate chip, the intermediate chip comprising a through electrode extending from the second wiring layer through the first silicon layer and the upper insulating layer, and an upper pad on the through electrode; and a lower chip comprising an image sensor processor, a third wiring layer at an upper portion of the lower chip, and a second silicon layer at a lower portion of the lower chip, the upper chip, the intermediate chip, and the lower chip being sequentially stacked from a top, a first pad of the first wiring layer and the upper pad bonded to each other, a second pad of the second wiring layer and a third pad of the third wiring layer bonded to each other, and a cross-section of a portion of the through electrode corresponding to the upper insulating layer having an inverted trapezoidal structure.

17. The three-layered stacked image sensor of claim 16, further comprising:

first shielding conductive layers separated from the first pad and at both sides of the first pad; and second shielding conductive layers separated from the upper pad and at both sides of the upper pad, wherein each of the first shielding conductive layers and the second shielding conductive layers is connected to ground.

* * * * *